(12) United States Patent
Nojima et al.

(10) Patent No.: US 10,943,048 B2
(45) Date of Patent: Mar. 9, 2021

(54) DEFECT INSPECTION APPARATUS AND DEFECT INSPECTION METHOD

(71) Applicant: TOSHIBA MEMORY CORPORATION, Tokyo (JP)

(72) Inventors: Kazuhiro Nojima, Yokkaichi Mie (JP); Tomohide Tezuka, Yokohama Kanagawa (JP); Atsushi Onishi, Nagoya Aichi (JP); Kazuhiro Yamada, Yokohama Kanagawa (JP); Shigeki Nojima, Yokohama Kanagawa (JP); Akira Hamaguchi, Kobe Hyogo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 85 days.

(21) Appl. No.: 16/288,112

(22) Filed: Feb. 28, 2019

(65) Prior Publication Data

US 2020/0089838 A1 Mar. 19, 2020

(30) Foreign Application Priority Data

Sep. 13, 2018 (JP) ............................. JP2018-171609

(51) Int. Cl.
*G06F 30/398* (2020.01)
*G01N 21/956* (2006.01)
(Continued)

(52) U.S. Cl.
CPC ....... *G06F 30/398* (2020.01); *G01N 21/8851* (2013.01); *G01N 21/95607* (2013.01);
(Continued)

(58) Field of Classification Search
CPC .............. G06F 30/398; G06F 2119/18; G06F 30/3323; G06F 30/39; G06F 30/367;
(Continued)

(56) References Cited

U.S. PATENT DOCUMENTS 7,890,908 B2 2/2011 Nojima et al.
8,595,666 B2 11/2013 Hayakawa et al.
(Continued)

FOREIGN PATENT DOCUMENTS

JP 2014-32100 A 2/2014

*Primary Examiner* — Nimesh Patel
(74) *Attorney, Agent, or Firm* — Foley & Lardner LLP

(57) ABSTRACT

An apparatus for inspecting a defect includes a memory storage and a processing unit coupled to the memory storage. The processing unit is configured to acquire pattern data for one or more patterns implemented on a wafer from a storage device, clip a portion that corresponds to the pattern data from a figure indicated by design data to generate design information and one or more circuit patterns, assign a first set of numbers to the one or more patterns of the pattern data, assign a second set of numbers to the one or more circuit patterns of the design information, generate relation information indicative of one or more correspondences between the first set of numbers and the second set of numbers, verify whether or not the one or more patterns indicated by the pattern data constitute a crucial defect based on the relation information, and send a verification result to a device.

15 Claims, 21 Drawing Sheets

(51) Int. Cl.
  *G06T 7/00* (2017.01)
  *G01N 21/88* (2006.01)
(52) U.S. Cl.
  CPC ...... *G06T 7/001* (2013.01); *G01N 2021/8854* (2013.01); *G06T 2207/10061* (2013.01); *G06T 2207/30148* (2013.01)
(58) Field of Classification Search
  CPC .... G06F 30/33; G06F 30/392; G06F 2111/04; G06F 2111/08; G06F 2111/20; G06F 30/20; G01N 21/95607; G01N 21/8851; G01N 2021/8854; G01N 23/2251; G01N 23/227; G01N 2223/6116; G01N 21/9501; G01N 2021/8861; G01N 21/956; G01N 2021/8864; G01N 2021/8867; G01N 2021/8874; G01N 2021/95615; G01N 21/95623; G01N 2223/611; G06T 7/001; G06T 2207/10061; G06T 2207/30148; G06T 2207/10056; G06T 7/0004; G06T 7/0006; G06T 2207/10144; G06T 2207/20021; G06T 2207/20081; G06T 5/006; G06T 7/0008; G06T 7/136; G06T 2207/30121; G06T 5/40; G06T 5/50; G06T 7/30; G06T 7/74; G06T 2207/20084; G06T 2207/20092; G06T 7/11; G06T 7/174; H01L 22/12; H01L 22/20; H01L 21/6719; H01L 21/67213; H01L 2224/48227; H01L 2924/3025; H01L 2924/00012; H01L 22/30; H01L 21/6833; H01L 2924/00; H01L 27/0886; H01L 29/6656; H01L 21/764; H01L 21/823418; H01L 21/823462; H01L 29/4933; H01L 29/665; H01L 2924/14; H01L 21/00; H01L 21/027; H01L 23/544; H01L 27/0207; H01L 27/14632; H01L 27/14687; H01L 2225/06544; H01L 22/00; H01J 37/28; H01J 2237/2817; H01J 37/222; H01J 2237/22; H01J 2237/202; H01J 2237/24592; H01J 2237/221; H01J 2237/20221; G06K 9/6256; G06K 9/4628; G06K 9/6267; G06K 9/6271; G06K 9/6255; G01R 31/311; G01R 31/307; G01R 31/2644; G01R 31/26; G01R 31/2656; G01R 31/2894; G01R 31/2831; G01R 31/2898; G06N 20/00; G06N 3/04; G06N 3/0454; G06N 3/08; G06N 3/082; G03F 1/36; G03F 1/70; G03F 7/7065; G03F 1/20; G03F 1/44
  See application file for complete search history.

(56) References Cited

U.S. PATENT DOCUMENTS

| | | | |
|---|---|---|---|
| 8,995,748 B2 | 3/2015 | Sakai et al. | |
| 9,858,658 B2 | 1/2018 | Kaizerman et al. | |
| 2007/0006115 A1* | 1/2007 | Nojima | G06F 30/398 438/703 |
| 2008/0279445 A1* | 11/2008 | Matsui | G06T 7/001 382/149 |
| 2012/0131529 A1* | 5/2012 | Hayakawa | G01N 21/95607 716/112 |
| 2012/0141011 A1* | 6/2012 | Sakai | G06T 7/001 382/149 |
| 2013/0070078 A1* | 3/2013 | Takagi | G06T 7/001 348/80 |
| 2013/0279790 A1* | 10/2013 | Kaizerman | G06T 7/001 382/144 |
| 2019/0086340 A1* | 3/2019 | Leu | H01L 22/20 |

* cited by examiner

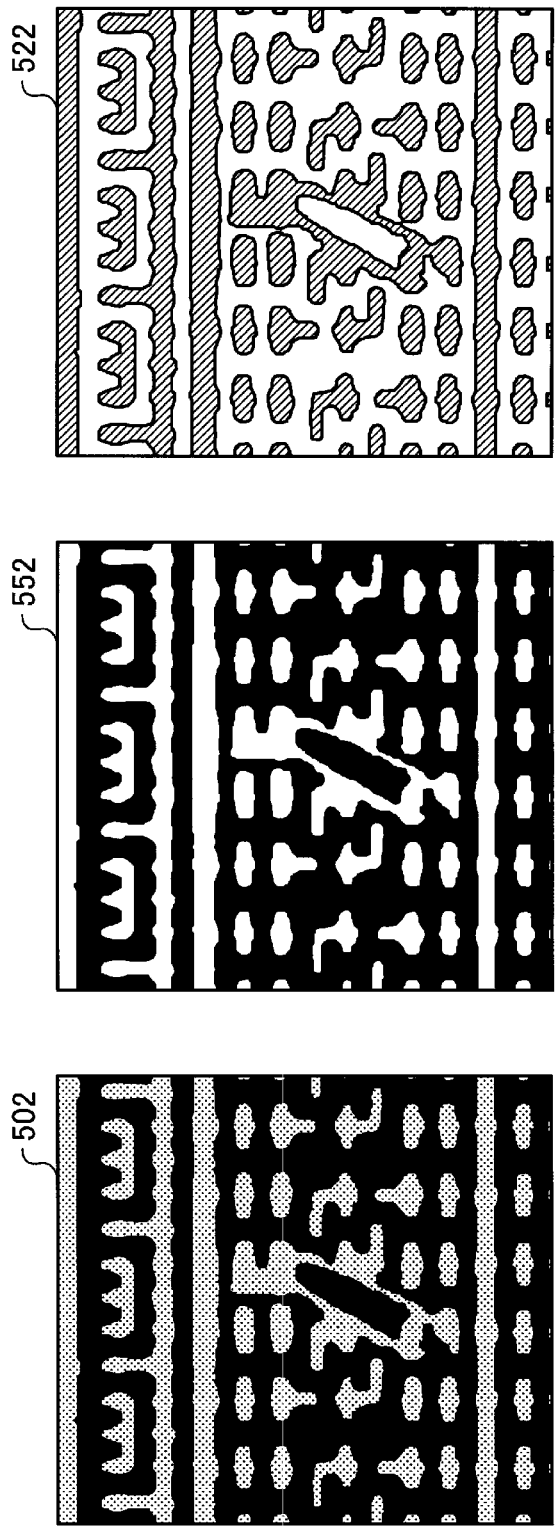

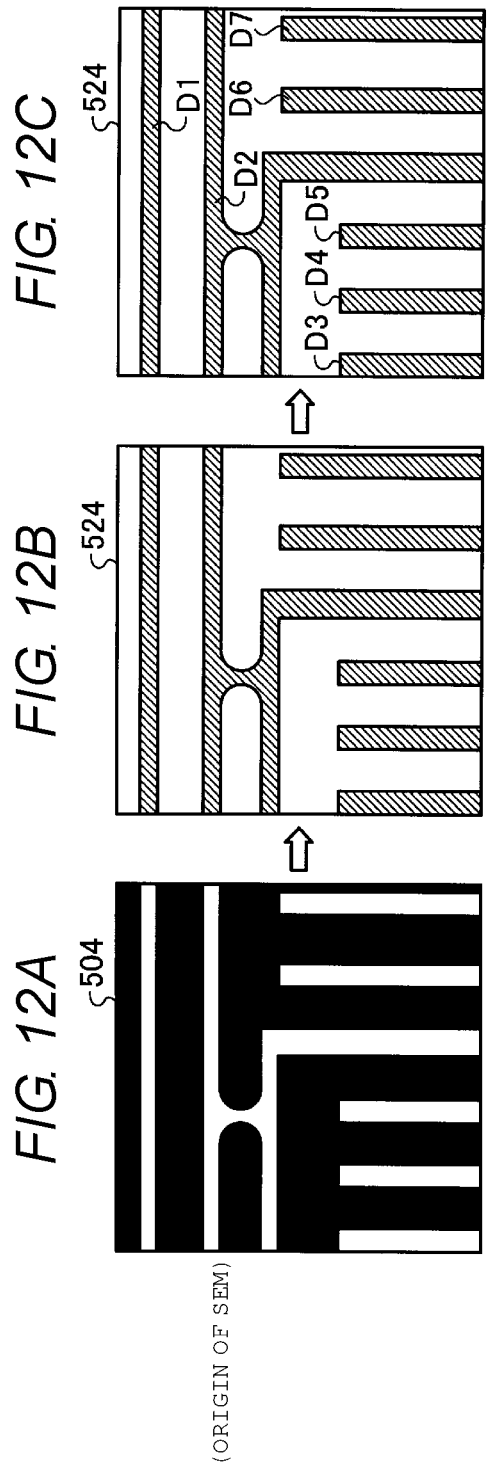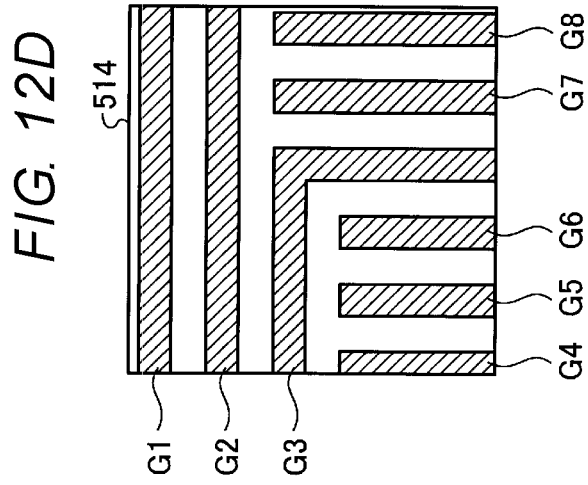

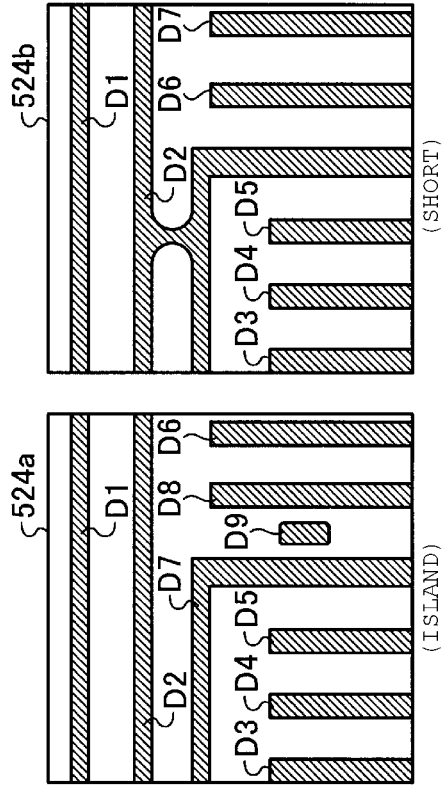
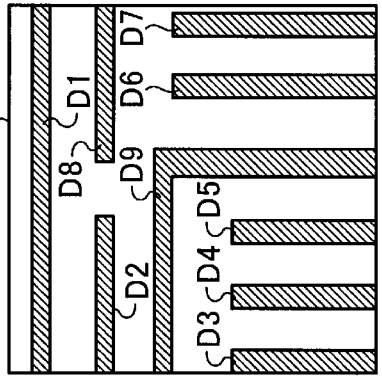
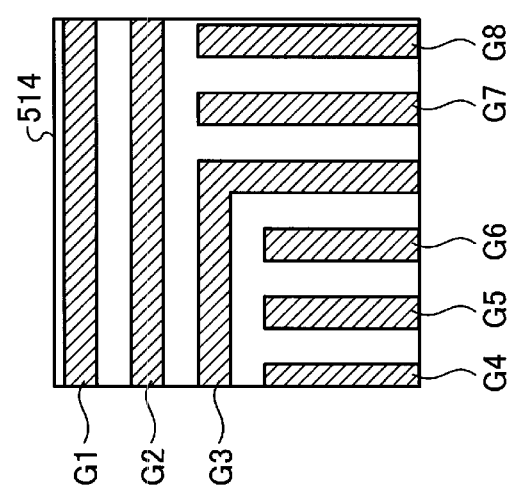
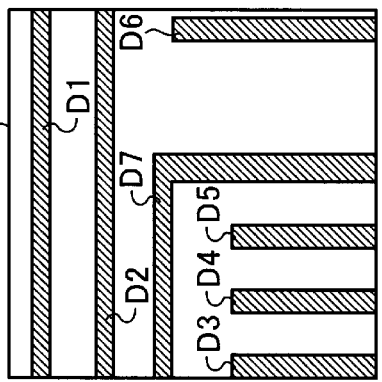

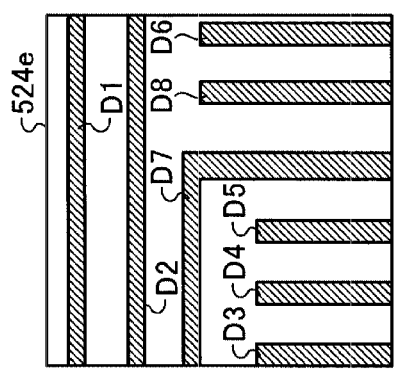
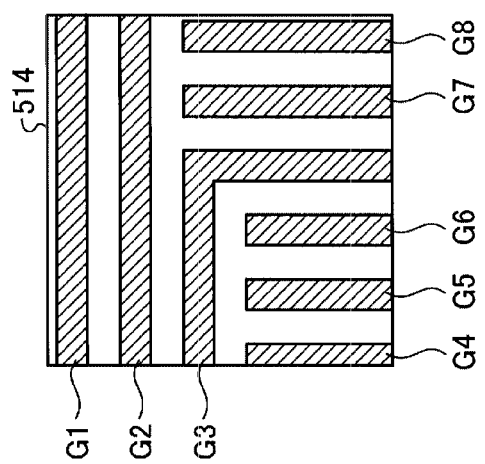

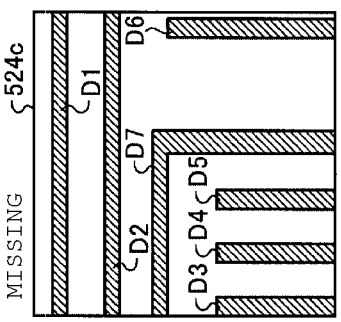
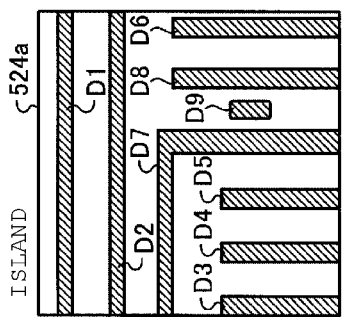
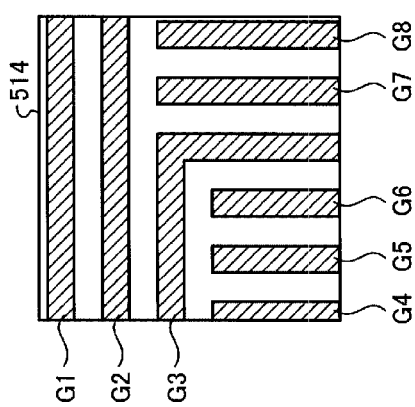

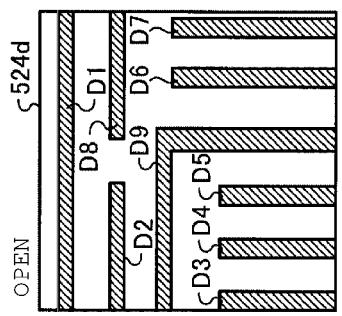
FIG. 16A
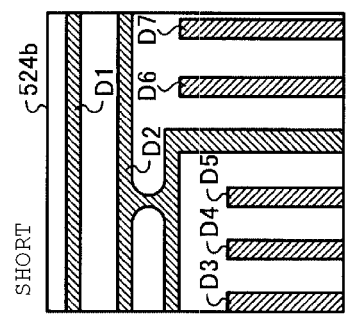
FIG. 16B
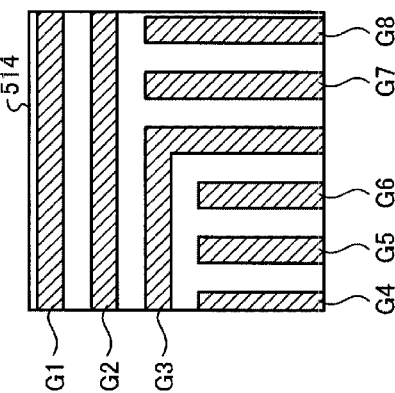
FIG. 16C
FIG. 16D
FIG. 16E

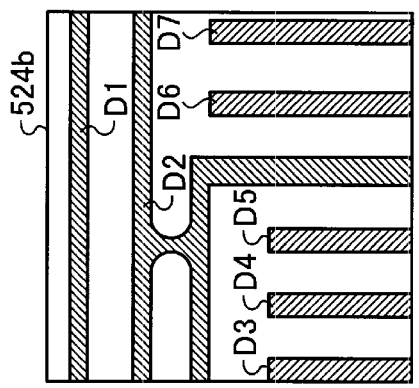
FIG. 19A
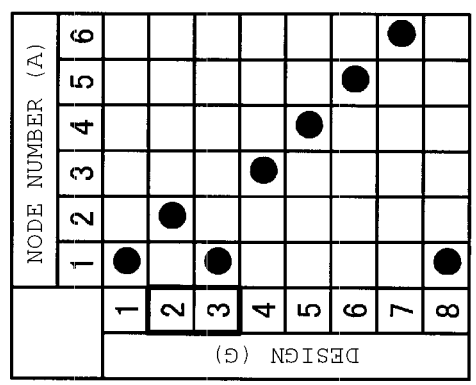
FIG. 19B
FIG. 19C
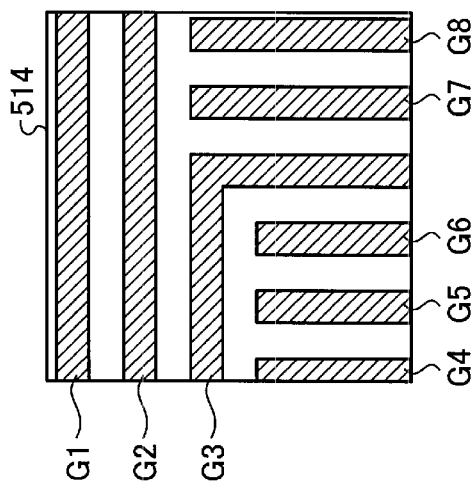
FIG. 19D
FIG. 19E
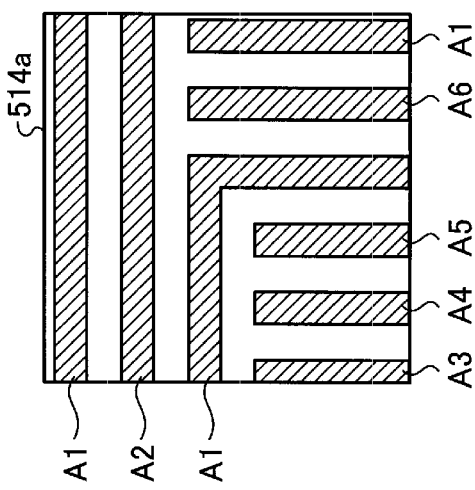

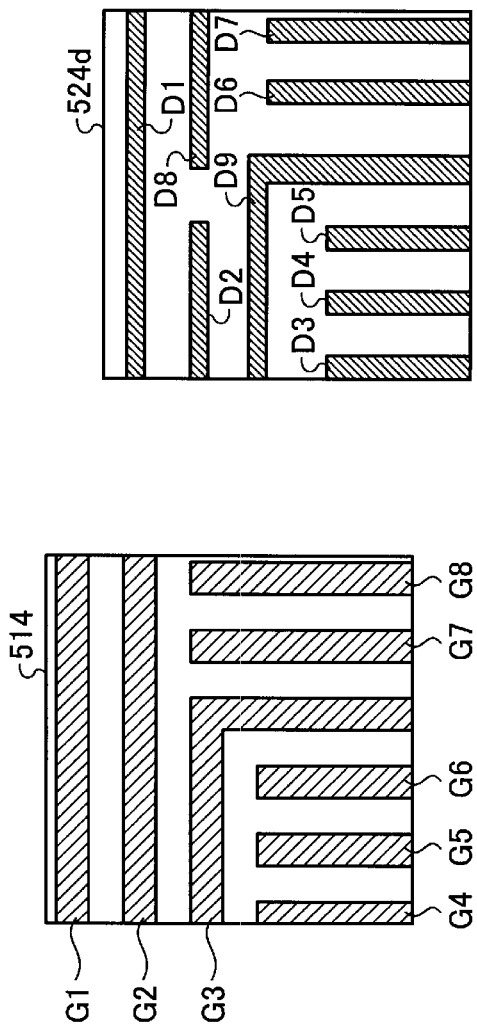

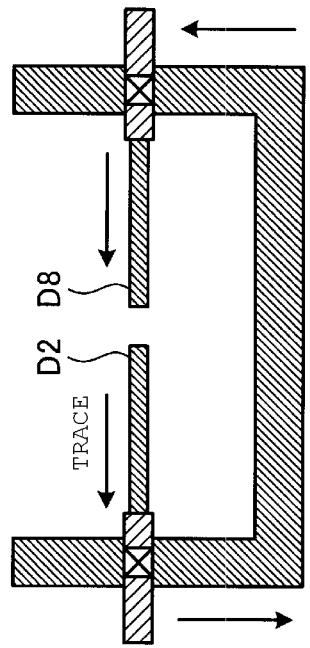
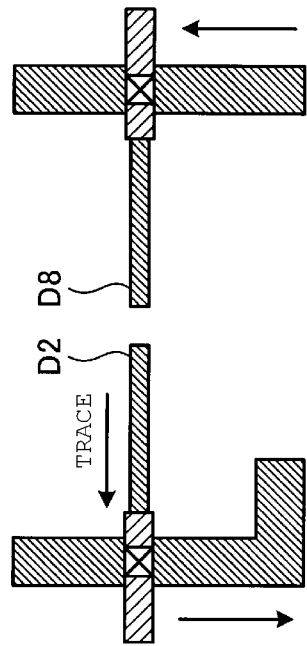
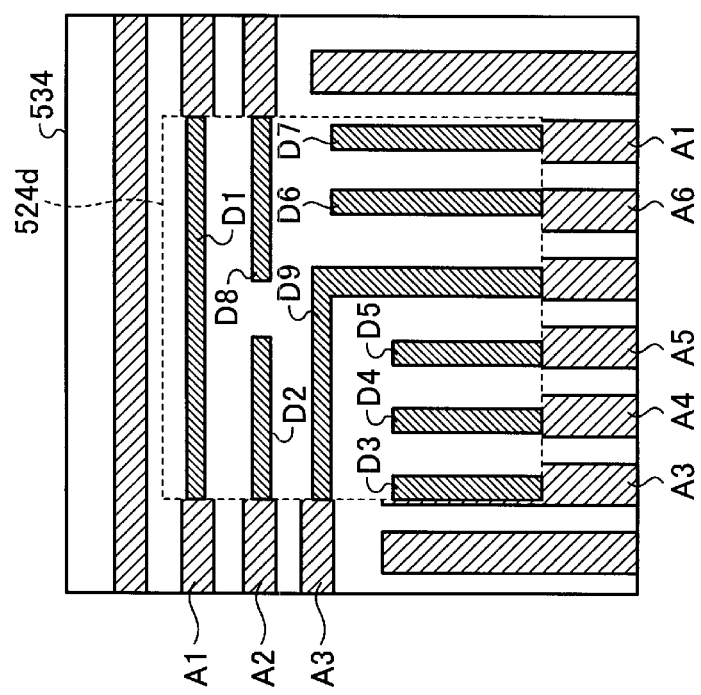

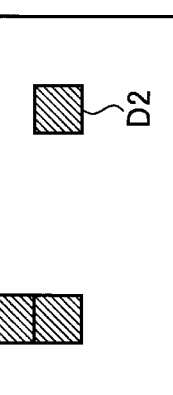
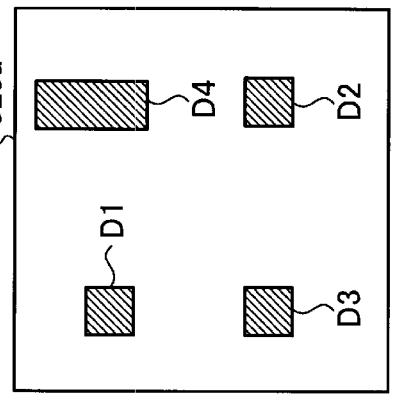
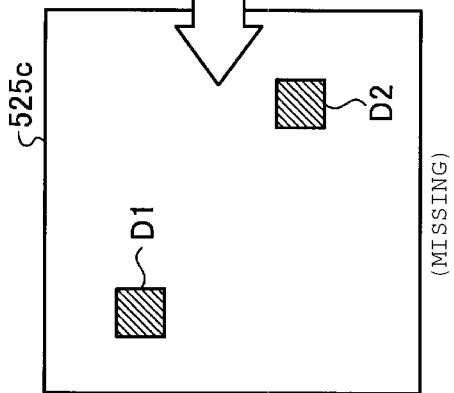

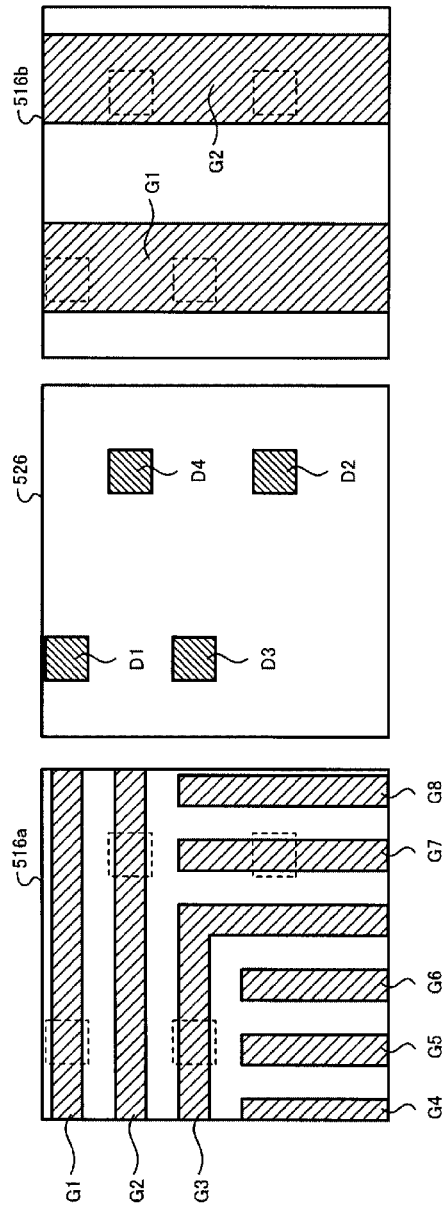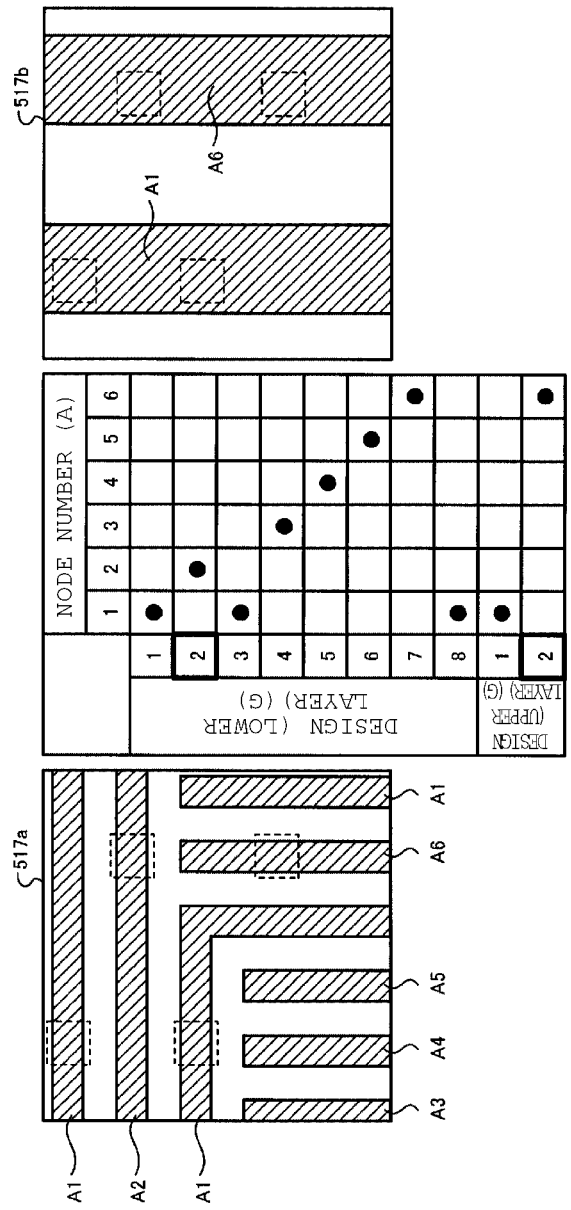

DEFECT INSPECTION APPARATUS AND DEFECT INSPECTION METHOD

CROSS-REFERENCE TO RELATED APPLICATION

This application claims the benefit of and priority to Japanese Patent Application No. 2018-171609, filed Sep. 13, 2018, the entire contents of which are incorporated herein by reference.

FIELD

Embodiments described herein relate generally to a defect inspection apparatus and a defect inspection method.

BACKGROUND

As a defect inspection method in a semiconductor manufacturing process, a Scanning Electron Microscope (SEM) image or the like can be acquired in the middle of a procedure, and the acquired SEM image is inspected by sight by a worker.

Furthermore, inspecting an electric influence of a defect may involve determining an occurrence spot and a kind of the defect and verifying a place where the defect occurs in a semiconductor circuit, which can be time consuming.

In addition, a method, called Die To Database, can be used to find the defect by acquiring a difference between image data, which is based on a design pattern (design) using Computer-Aided Design (CAD), and the acquired SEM image.

However, a pattern of the SEM image which is deployed on a wafer is largely dependent on, for example, an exposure condition when the pattern is formed, and thus it is difficult for the pattern of the SEM image to completely match with the design pattern. Therefore, it is difficult to accurately identify a defective portion and avoid misidentifying, or unnecessarily checking, non-defective portions.

Furthermore, a method for preparing CAD data based on the acquired SEM image and verifying the CAD data with circuit data may be used. In some cases, a range of an area which can be acquired in the SEM image is limited, and a degree of fatality of the defect may be dependent on a wiring connection issue in an area which is not included in the SEM image. This can be mitigated by verifying the entire chip, which can be time consuming.

DESCRIPTION OF THE DRAWINGS

FIGS. 6A to 6C are diagrams illustrating examples in which the SEM image is converted into CAD according to the embodiment.

FIGS. 12A to 12D are diagrams illustrating operations of giving (e.g., assigning or labelling) figure numbers in the SEM apparatus according to the embodiment.

FIGS. 13A to 13E are diagrams illustrating defect types in the SEM apparatus according to the embodiment.

FIGS. 14A to 14D are diagrams illustrating matching in the SEM apparatus according to the embodiment.

FIGS. 15A to 15E are diagrams illustrating the matching in the SEM apparatus according to the embodiment.

FIGS. 16A to 16E are diagrams illustrating the matching in the SEM apparatus according to the embodiment.

FIGS. 19A to 19E are diagrams illustrating the circuit verification in the SEM apparatus according to the embodiment.

FIGS. 21A to 21C are diagrams illustrating the circuit verification in the SEM apparatus according to the embodiment.

FIGS. 22A to 22C are diagrams illustrating the circuit verification in the SEM apparatus according to the embodiment.

FIGS. 23A to 23E are diagrams illustrating defect types in an SEM apparatus according to a modification example of the embodiment.

FIGS. 24A to 24F are diagrams illustrating circuit verification in the SEM apparatus according to the modification example of the embodiment.

DETAILED DESCRIPTION

Embodiments described herein provide for a defect inspection apparatus and a defect inspection method in which it is possible to reduce inspection time in defect inspection during manufacturing of a semiconductor device.

In general, according to one embodiment, An apparatus for inspecting a defect includes a memory storage and a processing unit coupled to the memory storage. The processing unit is configured to acquire pattern data indicative of one or more patterns implemented on a wafer from a storage device, clip a portion that corresponds to the pattern data from a figure indicated by design data to generate design information that indicates one or more circuit patterns, respectively assign a first set of numbers to each of the one or more patterns indicated by the pattern data, and respectively assign a second set of numbers to each of the one or more circuit patterns indicated by the design information, generate relation information indicative of one or more correspondences between the first set of numbers and the second set of numbers. The processing unit is further configured to verify whether or not the one or more patterns indicated by the pattern data constitute a crucial defect in a circuit of the wafer based on the relation information to generate a verification result, and send the verification result to a device.

Hereinafter, an SEM apparatus according to an embodiment will be described in detail with reference to the accompanying drawings. The described embodiment is an example and the present disclosure is not limited to that embodiment.

Figure 1A:
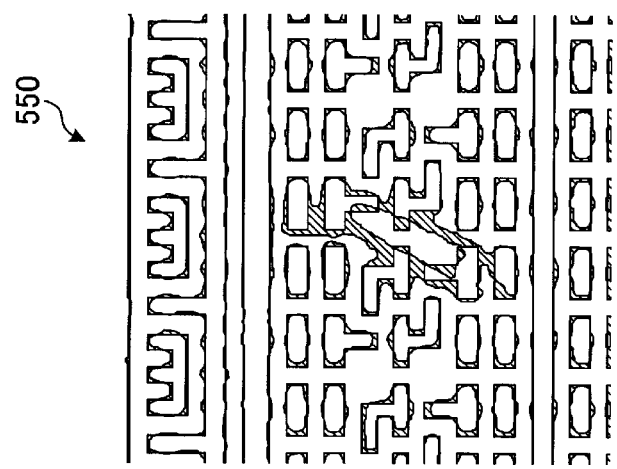
FIGS. 1A to 1C are diagrams illustrating a difference between an SEM image and an image based on CAD design data.
Figure 1B:
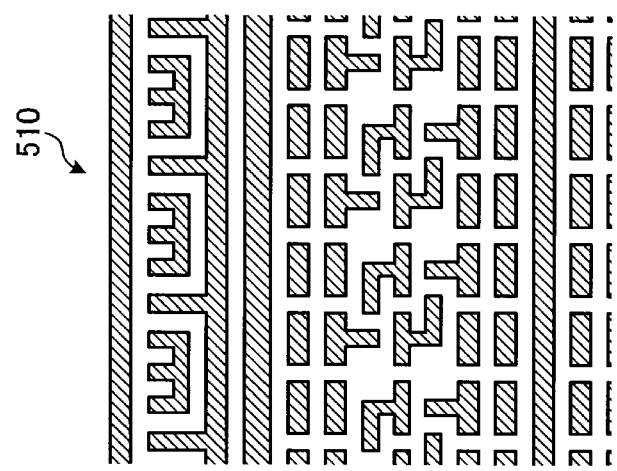
Figure 1C:
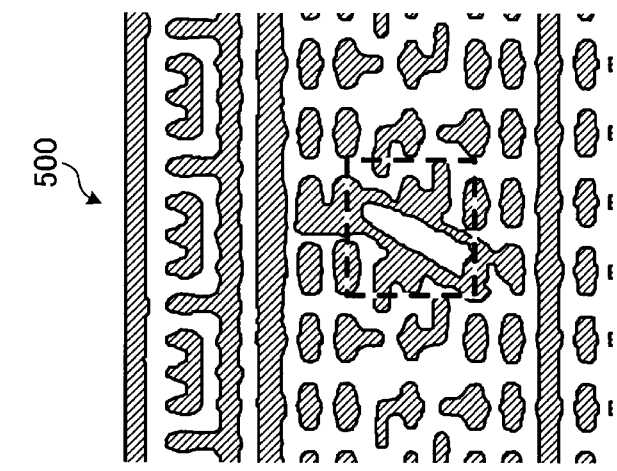

FIGS. 1A to 1C are diagrams illustrating a difference between an SEM image and an image based on CAD design data. Discrepancies between the SEM image and the design CAD will be described with reference to FIGS. 1A to 1C.

FIG. 1A illustrates an SEM image 500 which is acquired by irradiating a wafer with an electron beam from an electron source in the SEM apparatus in order to inspect a defect in a circuit of a chip in the wafer, on which various semiconductor components are mounted, and detecting secondary electrons emitted from the wafer. The image illustrated in FIG. 1A is a schematic illustration of an actual SEM image, and, here, is referred to as the SEM image for convenience. As illustrated using a dotted line in FIG. 1A, a defect in the circuit is included in the SEM image 500.

An image (referred to as a design CAD 510) based on data designed by the CAD corresponding to the SEM image 500 is illustrated in FIG. 1B. Theoretically, when a difference between the SEM image 500 illustrated in FIG. 1A and the design CAD 510 illustrated in FIG. 1B is extracted, only an image indicative of a defective portion is extracted. However, as described above, a pattern of the wafer shown in the SEM image is highly dependent on an exposure condition during formation of the pattern. Therefore, actually, as a portion of a difference image 550 illustrated in FIG. 1C, a portion of the circuit which is not related to the defective portion is extracted. The extracted portion may be referred to, for example, as a "difference", a "discrepancy", or an "error." As described above, it is difficult to completely match a portion of the pattern of the wafer other than the defective portion between the design pattern (design CAD) and the SEM image, and thus it is difficult to accurately extract only the defective portion as the difference.

Figure 2:
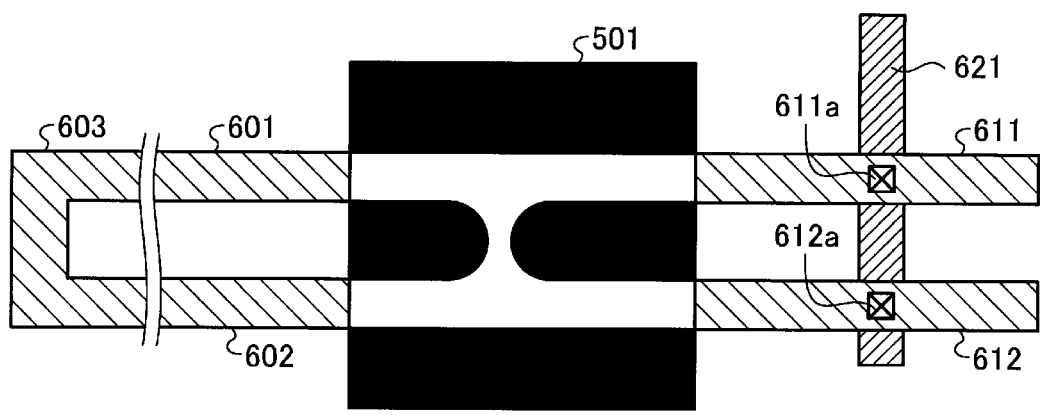
FIG. 2 is a diagram illustrating a layout versus schematic (LVS) (verification) operation which is performed with respect to a chip.

FIG. 2 is a diagram illustrating an LVS process, which is one defect inspection method performed with respect to a chip. A case where the defect exists in a local pattern of the SEM image and the LVS is performed on the chip will be described with reference to an example of FIG. 2.

The LVS is an operation or a tool for verifying whether or not discordance or discrepancies exist in a circuit for schematic data used to design the circuit of the wafer chip and the design pattern (design CAD) prepared to prepare the pattern. In the description according to the embodiment, a term LVS is used to indicate the-above described verification operation.

In a wiring pattern of FIG. 2, an acquired SEM image 501 illustrates states of wirings (white pattern) in which a local short (short-circuit) occurs. In the SEM image 501, an upper-side wiring 601 and a lower-side wiring 602 are viewed as being shorted at a central portion of the SEM image 501. However, as illustrated on a left side of FIG. 2, there is a possibility that the two wirings on the outside of a field of view of the SEM image 501 are improperly connected (e.g., short circuited) through a wiring 603. Otherwise, as illustrated on a right side of FIG. 2, a wiring 611 on the same layer as the upper-side wiring of the SEM image 501 and a wiring 612 on the same layer as the lower-side wiring of the SEM image 501 are not in contact as in the example described for the left side of FIG. 2. However, for example, there is a possibility that the respective wirings are improperly connected to each other through a via hole 611a and a via hole 612a, that is, a wiring 621.

As described above, when the LVS is performed using a replacement image, which is acquired by replacing a portion corresponding to the SEM image 501 by the SEM image 501 among the design patterns (design CAD) of the chip, and the schematic data, which is used to prescribe a connection state of the circuit of the chip, it is possible to determine whether or not the defect (e.g., a short circuit) on the SEM image 501 is an actually crucial defect (e.g., a significant defect that may trigger a corrective measure or action, such as a repair or replacement process, or a disposal of the defective circuit or device, or a flagging of the defect). In FIG. 2, the upper-side wiring and the lower-side wiring on the SEM image 501 are improperly connected through another wiring such as a wiring on a lower layer. Both the cases are similar to being short-circuited, and an operational problem does not exist even if it is determined that a short circuit occurs based on the SEM image 501. Therefore, it is determined that the chip as a whole has no crucial defect.

However, it may take a significant amount of time to perform the LVS on the chip as described above, and thus it may not be efficient to perform the LVS for every SEM image as the defect inspection. Hereinafter, in the embodiment, a configuration and an operation of the SEM apparatus, in which it is possible to reduce inspection time in the defect inspection during manufacturing of a semiconductor, will be described.

Figure 3:
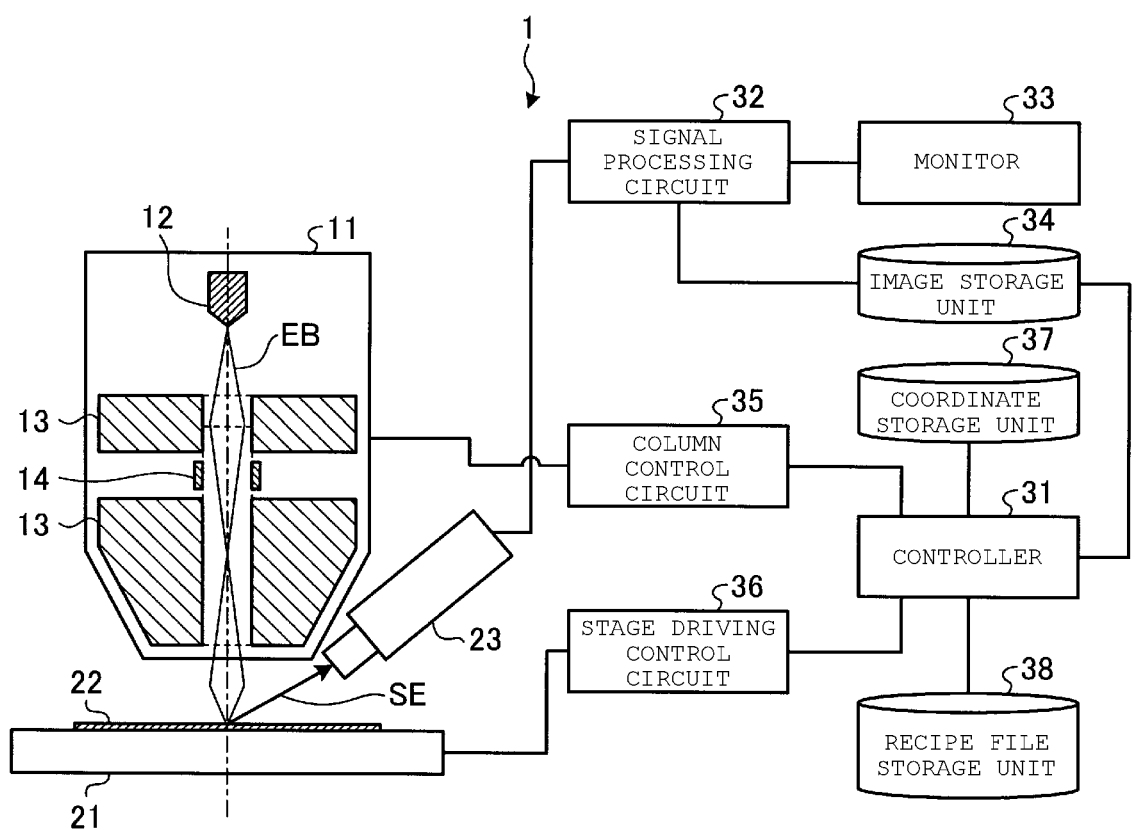
FIG. 3 is a diagram illustrating an example of a configuration of an SEM apparatus according to an embodiment.

FIG. 3 is a diagram illustrating an example of a configuration of the SEM apparatus according to the embodiment. The configuration of the SEM apparatus 1 according to the embodiment will be described with reference to FIG. 3.

As illustrated in FIG. 3, the SEM apparatus 1 according to the embodiment includes an electron gun barrel 11, a stage 21, a detector 23, a controller 31, a signal processing circuit 32, a monitor 33, an image storage unit 34, a column control circuit 35, a stage driving control circuit 36, a coordinate storage unit 37, and a recipe file storage unit 38. These components may include circuits and/or processor-executable instructions stored on machine-readable storage media configured to implement certain processes described herein.

The electron gun barrel 11 is a device which irradiates a sample (for example, a wafer 22 on the stage 21) with an electron beam EB. The electron gun barrel 11 includes an electron source 12, an electromagnetic lens 13, and a scanning coil 14 therein.

The electron source 12 is a device which irradiates with the electron beam EB by heating a filament that includes tungsten or the like.

The electromagnetic lens 13 is a lens that includes an electric line wound in a coil shape and a yoke that surrounds a periphery of the electric line, to generate a line of magnetic force which is a rotation target using currents which flow through the electric line, and to adjust a thickness of the electron beam EB irradiated from the electron source 12.

The scanning coil 14 is a coil that causes the sample to be irradiated with the electron beam EB which is irradiated from the electron source 12 and whose thickness is adjusted by the electromagnetic lens 13.

The stage 21 is a pedestal which is used to place the sample (e.g., the wafer 22). For example, the stage 21 performs movements, such as inclination of a placement surface and rotation of the placement surface, in addition to movement within a plane surface (an X axis and a Y axis) and movement in a vertical direction (a Z axis).

The detector 23 is a device that detects secondary electrons SE emitted from the wafer 22 by irradiating the wafer 22 with the electron beam EB from the electron source 12.

The controller 31 is a controller that controls the SEM apparatus 1. The controller 31 controls the signal processing circuit 32, the monitor 33, and the image storage unit 34, and performs a defect inspection process using the SEM image (an example of an electronic image) generated by the signal processing circuit 32.

The signal processing circuit 32 is a circuit that generates one image (SEM image) by detecting the secondary electrons detected by the detector 23 under the control of the controller 31. The SEM image generated by the signal processing circuit 32 is stored in the image storage unit 34. For example, the SEM image may be generated over the wafer chip in all the images. In some implementations, an abnormal portion of a pattern is previously specified using the optical inspection apparatus, and the SEM image may be generated for an area which includes coordinates of the abnormal portion. In addition, a target spot or principal detection spot (for example, a spot in which the defect in a circuit is easily generated and which is grasped from experience in the related art or a previous procedure, a spot at which a density of the pattern is high, or the like) may be previously set, and the SEM image may be generated for the detection spot.

The monitor 33 includes a display device, such as a Cathode Ray Tube (CRT) display, a liquid crystal display, or an organic Electro Luminescence (EL) display, which displays the SEM image or the like that is generated by the signal processing circuit 32.

The image storage unit 34 is a storage device that stores the SEM image generated by the signal processing circuit 32. For example, the image storage unit 34 is an electrically, magnetically, or optically storable storage device such as a Hard Disk Drive (HDD), a Solid State Drive (SSD), a flash memory, or an optical disk. The image storage unit 34 may store, for example, data of the design pattern (design CAD) of the chip, the schematic data, and the like, in addition to the SEM image. In addition, at least any of the SEM image, the design pattern (design CAD), and the schematic data may be stored in an external device on the outside of the SEM apparatus 1.

The column control circuit 35 is a circuit that controls an operation of the electron gun barrel 11 under the control of the controller 31. For example, the column control circuit 35 controls an electron beam checking operation performed by the electron source 12, an electron beam adjustment operation performed by the electromagnetic lens 13, an electron beam scan operation performed by the scanning coil 14, and the like.

The stage driving control circuit 36 is a circuit which controls an operation of the stage 21 on which the wafer 22 is placed under the control of the controller 31. For example, the stage driving control circuit 36 controls movement such as movement (X axis, Y axis) of the stage 21 on the plane surface, movement (Z axis) in a vertical direction, the inclination of the placement surface, the rotation of the placement surface, and the like.

The coordinate storage unit 37 is a storage device that stores coordinate data used to prescribe coordinates on the stage 21 (wafer 22) to be irradiated with the electron beam EB, coordinates to which the stage 21 is driven, and the like. For example, the coordinate storage unit 37 is the electrically, magnetically, or optically storable storage device such as the HDD, the SSD, the flash memory, or the optical disk.

The recipe file storage unit 38 is a storage device that stores a recipe file used to prescribe an instrumentation point, a measurement condition, and the like in order to acquire the SEM image by irradiating the stage 21 with the electron beam EB. For example, the recipe file storage unit 38 is the electrically, magnetically, or optically storable storage device such as the HDD, the SSD, the flash memory, or the optical disk.

In the example illustrated in FIG. 3, the image storage unit 34, the coordinate storage unit 37, and the recipe file storage unit 38 are illustrated as separate storage devices for convenience. However, the embodiment is not limited thereto, and the image storage unit 34, the coordinate storage unit 37, and the recipe file storage unit 38 may be configured as one storage device. In addition, at least any of the image storage unit 34, the coordinate storage unit 37, and the recipe file storage unit 38 may be provided in the external device on the outside of the SEM apparatus 1.

In addition, the configuration of the SEM apparatus 1 illustrated in FIG. 3 is an example, and the SEM apparatus 1 may further includes, for example, components other than the components illustrated in FIG. 3.

Figure 4:
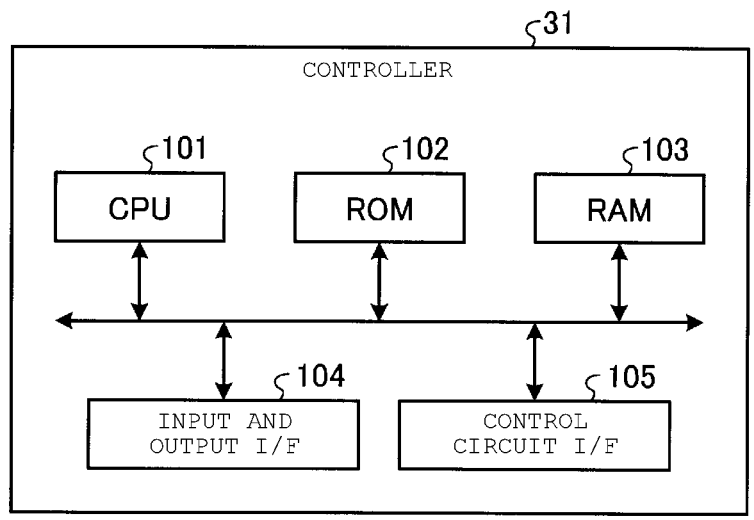
FIG. 4 is a diagram illustrating an example of a hardware configuration of a controller according to the embodiment.

FIG. 4 is a diagram illustrating an example of a hardware configuration of the controller according to the embodiment. The hardware configuration of the controller 31 according to the embodiment will be described with reference to FIG. 4.

As illustrated in FIG. 4, the controller 31 includes a Central Processing Unit (CPU) 101, a Read Only Memory (ROM) 102, a Random Access Memory (RAM) 103, an input and output I/F 104, and a control circuit I/F 105. The respective units are communicably connected to each other through a bus.

The CPU 101 is an arithmetic or logic device that controls the controller 31 and an operation of the SEM apparatus 1. The ROM 102 is a non-volatile storage device that stores a program, such as firmware, which is executed by the CPU 101 in order to control respective functions. The RAM 103 is a volatile storage device that is configured as a work area of the CPU 101.

The input and output I/F 104 is an interface that is configured to input and output data between the storage devices (the image storage unit 34, the coordinate storage unit 37, and the recipe file storage unit 38) on the outside of the controller 31.

The control circuit I/F 105 is an interface that is configured to exchange control data, which includes an operational instruction, among the signal processing circuit 32, the column control circuit 35, and the stage driving control circuit 36.

The hardware configuration of the controller 31 illustrated in FIG. 4 is illustrated as an example, and the controller 31 may include components other than the components illustrated in FIG. 4. For example, when the SEM apparatus 1 communicates data with the external device, for example, a network I/F corresponding to a communication protocol, such as a Transmission Control Protocol (TCP)/Internet Protocol (IP) or a User Datagram Protocol (UDP/IP), may be provided.

Figure 5:
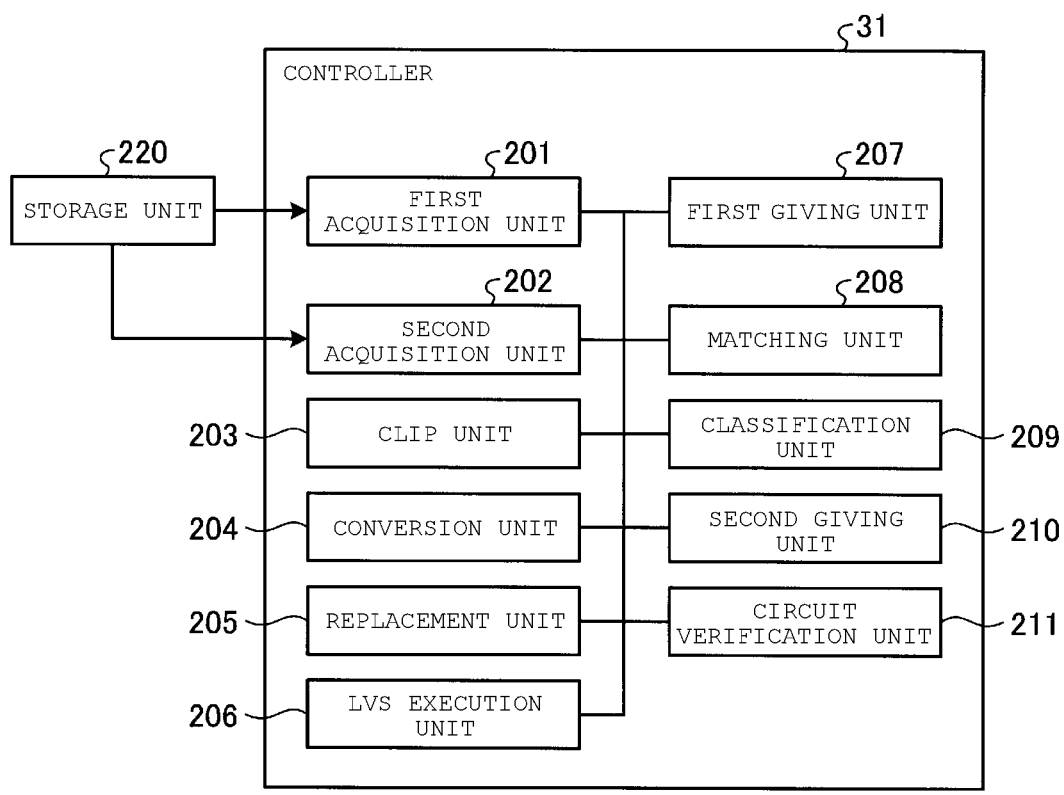
FIG. 5 is a diagram illustrating an example of a configuration of functional blocks of the controller according to the embodiment.
Figure 7A:
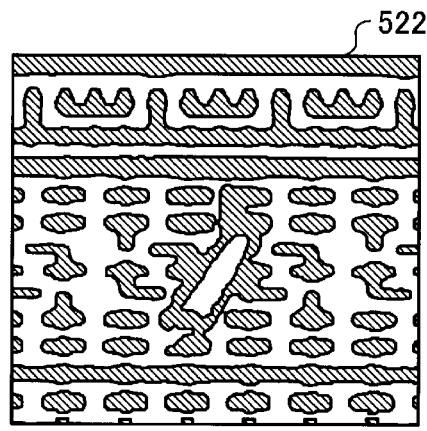
FIGS. 7A and 7B are diagrams illustrating examples in which design CAD is replaced by the SEM image according to the embodiment.
Figure 7B:
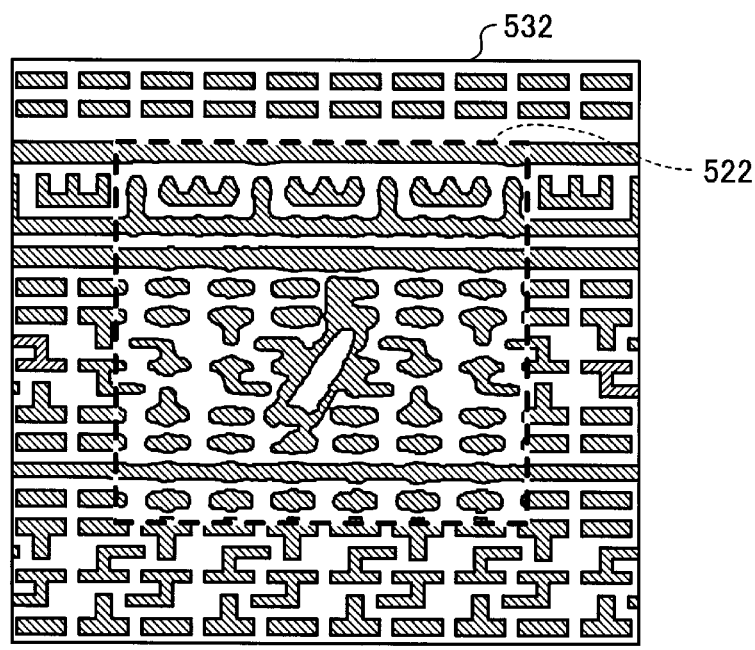
Figure 8:
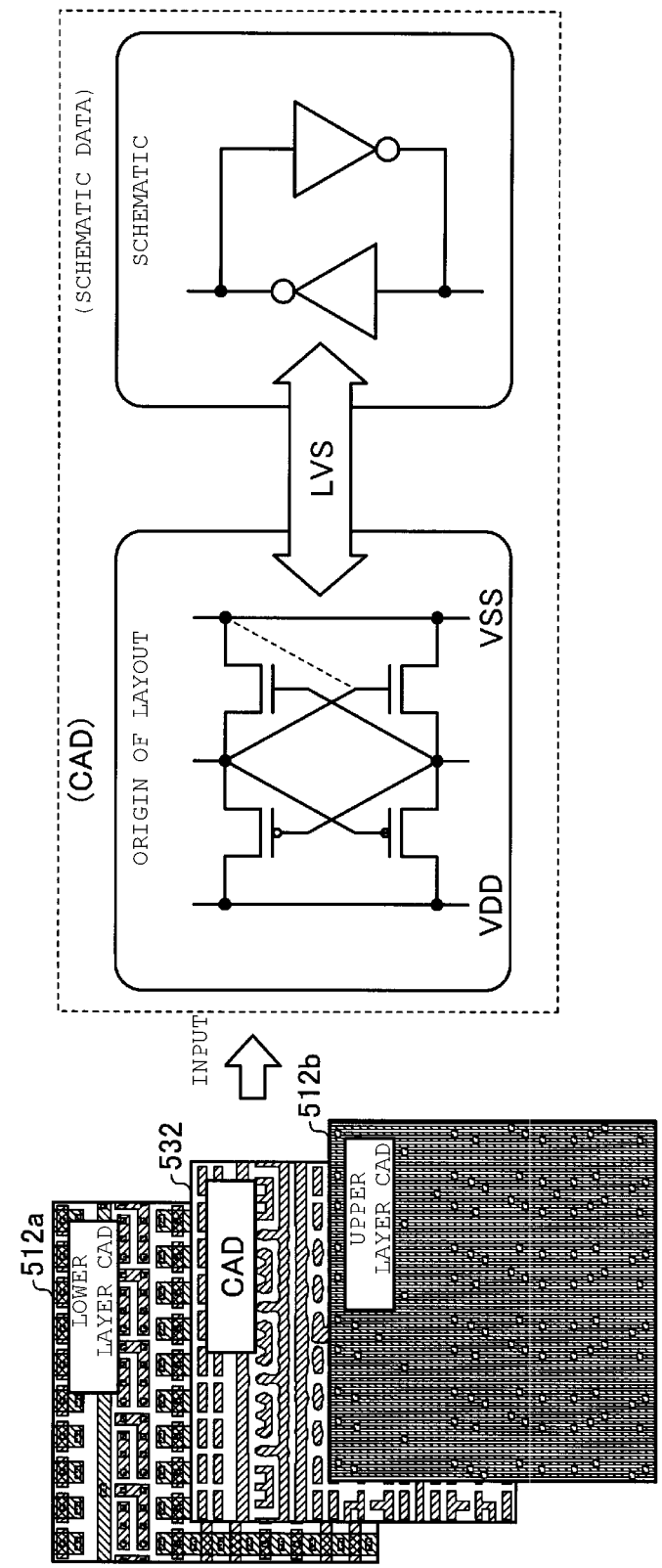
FIG. 8 is a diagram illustrating a general operation of the LVS of the SEM apparatus according to the embodiment.
Figure 9:
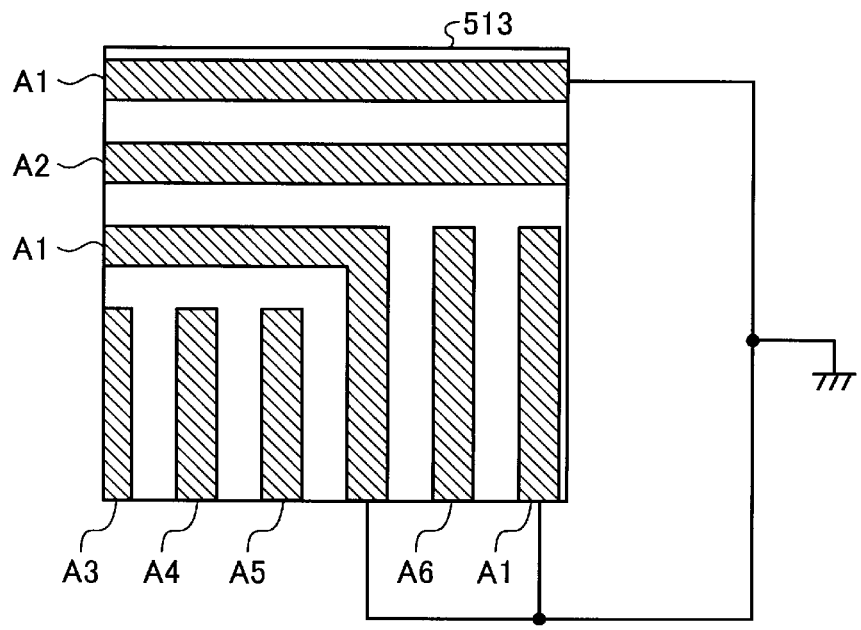
FIG. 9 is a diagram illustrating node numbers in the SEM apparatus according to the embodiment.

FIG. 5 is a diagram illustrating an example of a configuration of functional blocks of the controller according to the embodiment. FIGS. 6A to 6C are diagrams illustrating examples, in which the SEM image is converted into CAD, according to the embodiment. FIGS. 7A to 7B are diagrams illustrating examples, in which the design CAD is replaced by the SEM image, according to the embodiment. FIG. 8 is a diagram illustrating a general operation of the LVS of the SEM apparatus according to the embodiment. FIG. 9 is a diagram illustrating node numbers in the SEM apparatus according to the embodiment. The configuration of the functional blocks of the controller 31 of the SEM apparatus 1 according to the embodiment will be described with reference to FIGS. 5 to 9.

As illustrated in FIG. 5, the controller 31 according to the embodiment includes a first acquisition unit 201 (acquisition unit), a second acquisition unit 202, a clip unit 203, a conversion unit 204, a replacement unit 205, an LVS execution unit 206 (execution unit), a first giving unit 207 (giving unit), a matching unit 208, a classification unit 209, a second giving unit 210, and a circuit verification unit 211. These components may include circuits and/or processor-executable instructions stored on machine-readable storage media configured to implement certain processes described herein.

The first acquisition unit 201 is a functional unit that acquires the SEM image indicative of the local pattern on the wafer, which is generated by the signal processing circuit 32 stored in an external storage unit 220. The first acquisition unit 201 is realized through execution of the program by the CPU 101 and the input and output I/F 104 which are illustrated in FIG. 4. In addition, the storage unit 220 is realized by, for example, the image storage unit 34 illustrated in FIG. 3. The storage unit 220 may be provided in the external device on the outside of the SEM apparatus 1. In this case, the first acquisition unit 201 may acquire the SEM image from the external device through the above-described network I/F.

The second acquisition unit 202 is a functional unit that acquires design CAD data (an example of design data) stored in the external storage unit 220. The second acquisition unit 202 is realized through execution of the program by the CPU 101 and the input and output I/F 104 which are illustrated in FIG. 4.

The clip unit 203 is a functional unit that clips a portion corresponding to the SEM image, which is acquired by the first acquisition unit 201, among the figures indicated by (e.g., included in) the design CAD data of the chip acquired by the second acquisition unit 202. Hereinafter, a portion of a CAD figure, which is indicated by the design CAD data (e.g. included in the design CAD data) and corresponds to the SEM image clipped by the clip unit 203, may be simply referred to as a "design CAD" (an example of the design information).

The conversion unit 204 is a functional unit that converts the SEM image acquired by the first acquisition unit 201 into the CAD data. For example, the conversion unit 204 binarizes (e.g. converts to, or encodes in, a binary format) an SEM image 502 illustrated in FIG. 6A while using a prescribed luminance value as a boundary, and generates a binarization image 552 illustrated in FIG. 6B. Furthermore, the conversion unit 204 converts the binarization image 552 into the CAD data (defect CAD 522) illustrated in FIG. 6C. Hereinafter, the CAD data converted from the SEM image by the conversion unit 204 may be referred to as a "conversion CAD" (an example of conversion information). Thus the conversion CAD may be based on a SEM image.

The replacement unit 205 is a functional unit that replaces a portion of a CAD figure corresponding to the conversion CAD with the conversion CAD, in a figure indicated by the design CAD data of the chip acquired by the second acquisition unit 202. Hereinafter, there is a case where the CAD data, which is acquired by the replacement unit 205 by replacing the portion corresponding to the conversion CAD in the figure indicated by the design CAD data of the chip by the conversion CAD, is referred to as a "replacement CAD". For example, the replacement unit 205 acquires a replacement CAD 532 illustrated in FIG. 7B by acquiring a figure indicated by the design CAD data, and replacing a portion of the figure corresponding to the defect CAD 522 (conversion CAD) illustrated in FIG. 7A with the defect CAD 522.

The LVS execution unit 206 is a functional unit that performs the LVS for verifying whether or not the schematic data, which is acquired by designing a circuit of the wafer chip, matches with the CAD data (design CAD data or the like) on the circuit. For example, as illustrated in FIG. 8, the LVS execution unit 206 inputs, as the CAD data which is a target of the LVS, the replacement CAD 532, a lower layer CAD 512a which is the CAD data on the lower layer of the replacement CAD 532, and an upper layer CAD 512b which is the CAD data on the upper layer of the replacement CAD 532, and performs the LVS using the CAD data and the schematic data.

When the LVS execution unit 206 performs the LVS between the schematic data and the design CAD data corresponding to the chip, an Added Node GDS File (AGF), to which information indicative of whether or not respective wiring patterns indicated by the design CAD data are improperly connected (e.g., short circuited) to each other, is acquired. When the plurality of wiring patterns on the design CAD data are improperly connected (short-circuited) at any of places on the chip in the AGF, the wiring patterns correlate with the same number (node number which is an example of node information). Connection (e.g., short circuit) states of the respective wiring patterns of the design CAD data are grasped through the AGF. For example, it is possible to give (e.g., provide, or label) the node numbers (A1 to A6 in FIG. 9) indicative of the improperly connected (short-circuited) wiring patterns with respect to the respective wiring patterns indicated by the design CAD 513 clipped from the design CAD data, as illustrated in FIG. 9.

The first giving unit 207 is a functional unit that respectively gives numbers (e.g., figure numbers, such as a first number and a second number) in a certain order to the respective wiring patterns of the conversion CAD acquired by the conversion unit 204 and the respective wiring patterns of the conversion CAD acquired by the clip unit 203 in order to determine a defect type of the conversion CAD which will be described later.

The matching unit 208 is a functional unit that correlates (matches) the wiring patterns of the conversion CAD with the wiring patterns of the design CAD using the given figure numbers.

The classification unit 209 is a functional unit that performs classification (determination) on defect kinds (defect types) of the wiring patterns of the conversion CAD based on a result of matching performed by the matching unit 208. The defect types acquired through classification will be described in detail later.

The second giving unit 210 is a functional unit that gives (e.g., assigns) the node numbers to the respective wiring patterns of the design CAD based on the AGF acquired by the LVS execution unit 206. For example, a conception is provided that includes an operation or the like in a case where the design CAD, which correlates with the node numbers is acquired, by clipping a portion corresponding to the conversion CAD from the design CAD data of the chip, which includes respective wiring patterns which correlate with the node numbers, as a result of the LVS.

The circuit verification unit 211 is a functional unit that determines whether or not a crucial defect exists on the circuit for the wiring patterns indicated by the conversion CAD using the result of matching, which is performed by the matching unit 208 on the conversion CAD and the design CAD, and the node numbers which are given to the design CAD by the second giving unit 210. A detailed operation of the circuit verification unit 211 will be described later.

The clip unit 203, the conversion unit 204, the replacement unit 205, the LVS execution unit 206, the first giving unit 207, the matching unit 208, the classification unit 209, the second giving unit 210, and the circuit verification unit 211 may be realized via a software program executed by the CPU 101 illustrated in FIG. 4. Some or all of the above-described functional units may be realized by a hardware circuit, such as a Field-Programmable Gate Array (FPGA) or an Application Specific Integrated Circuit (ASIC), instead of, or in conjunction with, execution of the software program.

The respective functional units of the controller illustrated in FIG. 5 are described by conceptually illustrating functions, and the embodiment is not limited to the configuration. For example, the plurality of functional units, which are illustrated as independent functional units in the controller 31 illustrated in FIG. 5, may be configured as one functional unit. In contrast, in the controller 31 illustrated in FIG. 5, a function that one functional unit has may be divided into a plurality of functions and the functions may be configured as a plurality of functional units.

Figure 10:
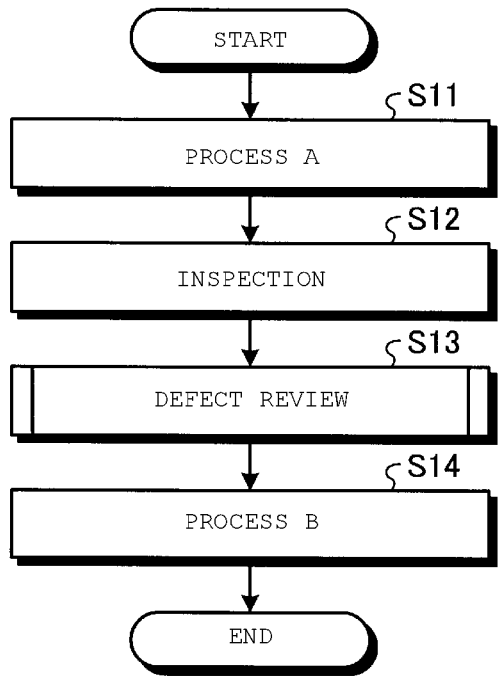
FIG. 10 is a flowchart illustrating a process including a defect inspection process according to the embodiment.

FIG. 10 is a flowchart illustrating a process including the defect inspection process according to the embodiment. A concept of the process of a semiconductor manufacturing procedure including the defect inspection process performed by the SEM apparatus 1 according to the embodiment, will be described with reference to FIG. 10.

(Step S11)

In the semiconductor manufacturing process, a pre-procedure (process A) before an inspection procedure is performed. In the process A, for example, circuit patterns or the like are formed through lithography after cleaning, oxidation, diffusion, and film formation of the wafer are performed. Thereafter, the process transitions to step S12.

(Step S12)

The inspection procedure, in which inspection and instrumentation are performed, is performed with respect to the wafer on which the circuit patterns (wiring patterns) are formed. In the inspection procedure, for example, the defect inspection for detecting an abnormal pattern from a difference between an optical image, which is acquired from the adjacent same patterns, and the SEM image with respect to the circuit patterns formed on the wafer, measurement of line widths and hole diameters of the circuit patterns, and detection of the process abnormality from instrumentation of a thickness of the wafer, and the like are performed. In the inspection procedure, the SEM image may be generated by the above-described electron gun barrel 11, the detector 23, and the signal processing circuit 32 at a portion which is a target on the wafer, and may be stored in the storage unit 220. In the step, the LVS execution unit 206 may previously perform the LVS between the schematic data and the design CAD data corresponding to the chip, and may acquire the AGF. Thereafter, the process transitions to step S13.

(Step S13)

A defect review procedure is performed for inspecting whether or not the circuit patterns formed on the wafer have a connection relation as designed, that is, whether or not a defect exists on the circuit. The defect review procedure corresponds to the defect inspection process performed by the SEM apparatus 1 according to the embodiment. The defect inspection process will be described in detail later. Thereafter, the process transitions to step S14.

(Step S14)

A post-procedure (process B) is performed after the defect review procedure. In the process B, for example, dicing is performed for cutting and chipping an integrated circuit or the like, which is formed on the wafer, and packaging, which includes a process for protecting a chip on which the integrated circuit cut through the dicing is mounted and for connecting to an adjacent circuit, is performed. When the post-procedure ends, the semiconductor manufacturing process ends.

The processes in the above-described respective steps are examples, and it is apparent that the processes may further include another process or procedure and may be repeatedly performed a plurality of times.

Figure 11:
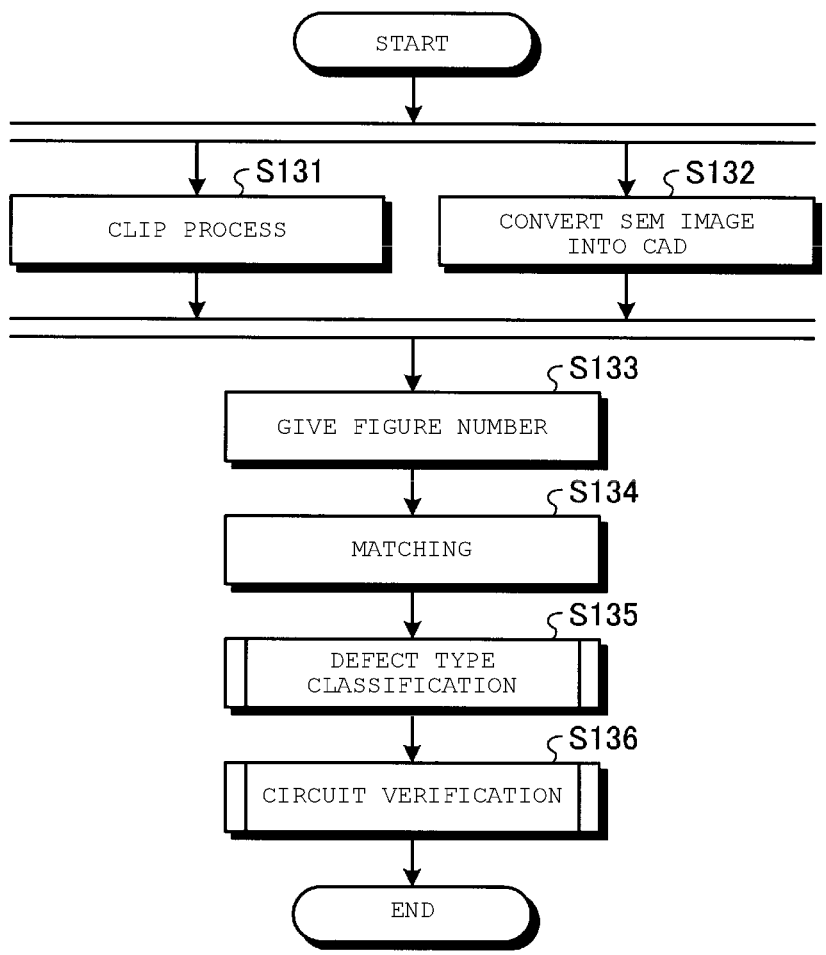
FIG. 11 is a flowchart illustrating the defect inspection process in the SEM apparatus according to the embodiment.

FIG. 11 is a flowchart illustrating the defect inspection process performed by the SEM apparatus according to the embodiment. FIGS. 12A to 12D are diagrams illustrating operations of giving the figure numbers in the SEM apparatus according to the embodiment. FIGS. 13A to 13E are diagrams illustrating defect types in the SEM apparatus according to the embodiment. FIGS. 14A to 14D are diagrams illustrating matching in the SEM apparatus according to the embodiment. FIGS. 15A to 15E are diagrams illustrating matching in the SEM apparatus according to the embodiment. FIGS. 16A to 16E are diagrams illustrating matching in the SEM apparatus according to the embodiment. A flow of the defect inspection process in the SEM apparatus 1 according to the embodiment will be described with reference to FIGS. 11 to 16E. It is assumed that the LVS is previously performed between the schematic data and the design CAD data corresponding to the chip by the LVS execution unit 206, and the AGF is acquired.

(Step S131)

The first acquisition unit 201 of the SEM apparatus 1 acquires the SEM image indicative of the local pattern on the wafer, which is generated by the signal processing circuit 32 and is stored in the external storage unit 220. The second acquisition unit 202 of the SEM apparatus 1 acquires the design CAD data for the wafer, which is a target of the defect inspection process, from the external storage unit 220. The clip unit 203 of the SEM apparatus 1 acquires the design CAD by clipping a portion corresponding to the SEM image, which is acquired by the first acquisition unit 201, in the figure indicated by the design CAD data of the chip which is acquired by the second acquisition unit 202. Thereafter, the end of step S132 is checked and the process transitions to step S133.

(Step S132)

The conversion unit 204 of the SEM apparatus 1 acquires the conversion CAD by converting the SEM image, which is acquired by the first acquisition unit 201, into the CAD data in parallel with the process in step S131. Thereafter, the end of step S131 is checked and the process transitions to step S133.

(Step S133)

In order to determine the defect type of the conversion CAD which will be described later, the first giving unit 207 of the SEM apparatus 1 gives numbers (figure numbers) to each of the wiring patterns of the conversion CAD, which is acquired by the conversion unit 204, and each of the wiring patterns of the design CAD, which is acquired by the clip unit 203, in respective certain orders.

For example, the first giving unit 207 gives figure numbers D1 to D7 with respect to the respective wiring patterns of the conversion CAD 524, which is illustrated in FIG. 12B and is converted from the SEM image 504 illustrated in FIG. 12A, as illustrated in FIG. 12C. Similarly, the first giving unit 207 gives figure numbers G1 to G8 with respect to the respective wiring patterns of a design CAD 514 which is the design CAD corresponding to the conversion CAD 524. When the numbers are given to the respective wiring patterns of the conversion CAD and the design CAD, different figure numbers are given to different wiring patterns. However, the order of the figure numbers to be given may be selected as appropriate, or may be arbitrary. For example, although it is determined that the wiring pattern indicated by the figure number D3 in the conversion CAD 524 illustrated in FIG. 12C corresponds to the wiring pattern indicated by the figure number G4 in the design CAD 514 illustrated in FIG. 12D, the figure numbers may be different from each other.

Here, first, the defect types, which are acquired through defect type classification in step S135 that will be described later, will be described with reference to FIGS. 13A to 13E. The design CAD 514, to which figure numbers G1 to G8 illustrated in FIG. 13A are given, is similar to the conversion CAD 524 illustrated in the above-described FIG. 12C. Figure numbers D1 to D9 are given to a conversion CAD 524a illustrated in FIG. 13B. Since, compared to the design CAD 514, an undesired (e.g., a redundant) wiring pattern indicated by the figure number D9 exists, the wiring pattern indicated by the figure number D9 is classified into a defect type "island". Figure numbers D1 to D7 are given to a conversion CAD 524b illustrated in FIG. 13C. Since FIG. 13C includes the wiring pattern indicated by the figure number D2, in which the wiring pattern indicated by the figure number G2 and the wiring pattern indicated by the figure number G3 in the design CAD 514 are short-circuited (shorted), and thus the wiring pattern indicated by the figure number D2 is classified into a defect type "short". Figure numbers D1 to D7 are given to a conversion CAD 524c illustrated in FIG. 13D. Since the wiring pattern indicated by the figure number G7 in the design CAD 514 does not exist, the wiring pattern indicated by the figure number G7 is classified into a defect type "missing". Figure numbers D1 to D9 are given to a conversion CAD 524d illustrated in FIG. 13E. Since the wiring pattern indicated by the figure number G2 in the design CAD 514 shows a state of being separated into a wiring pattern indicated by the figure number D2 and a wiring pattern indicated by the figure number D8, the wiring pattern indicated by the figure number G2 is classified into a defect type "open". The defect types classified through the defect type classification in step S135 are not limited to a fact that the defect types indicate the crucial defect in an actual circuit in a classification stage, and determination of whether or not the crucial defect exists on the circuit of the chip may be finally performed in circuit verification of step S136.

Returning to FIG. 11 and continuing the description. After the figure numbers are given by the first giving unit 207 in step S133, the process transitions to step S134.

(Step S134)

The matching unit 208 of the SEM apparatus 1 correlates (matches) the wiring patterns of the conversion CAD with the wiring patterns of the design CAD using the given figure numbers.

For example, when a design CAD 514, to which figure numbers G1 to G8 illustrated in FIG. 14A are given, is matched with a conversion CAD 524e, to which figure numbers D1 to D8 illustrated in FIG. 14B are given, the matching unit 208 superimposes the design CAD 514 on the conversion CAD 524e, and prepares information (an example of the relation information) of a matrix as illustrated in FIG. 14C such that it is possible to grasp a correlation between the figure numbers of the superimposed wiring patterns. The matrix illustrated in FIG. 14C indicates that the figure numbers, which are the same as in the design CAD, correspond to the figure numbers of the conversion CAD. In the matrix, "Σ" ("Σ" in "design (G)"), which exists in row, illustrates the number of wiring patterns which correspond to a wiring pattern indicated by a specific figure number of the conversion CAD (originating in SEM) and which exist on the design CAD (originating in design). In contrast, in the matrix, "Σ" ("Σ" in "SEM(D)"), which exists in column, illustrates the number of wiring patterns which correspond to the wiring pattern indicated by a specific figure number of the design CAD (originating in design) and which exist on the conversion CAD (originating in SEM). In the matrix illustrated in FIG. 14C, all the values of "Σ" in the row are 1 and all the values of "Σ" in the column are 1, and thus the wiring patterns of the design CAD correspond to the wiring patterns of the conversion CAD in a one to one manner. Here, the conversion CAD is classified into a defect type "non-defect".

However, as described above, the figure numbers which are given by the first giving unit 207 are given in certain order, and thus the embodiment is not limited to a fact that the same figure numbers are given to the same wiring patterns in the design CAD and the conversion CAD. In the examples illustrated in FIGS. 14A to 14D, the figure numbers do not coincide with each other in the wiring patterns specified by the figure numbers of the design CAD 514 and the wiring patterns specified by the figure numbers of the conversion CAD 524e. However, a matrix, which indicates the correlation between the figure numbers prepared for the design CAD 514 and the conversion CAD 524e by the matching unit 208, is a matrix illustrated in FIG. 14D. Here, all the values of "Σ" in row are 1, all the values of "Σ" in column are 1, and the wiring patterns of the design CAD correlate with the wiring patterns of the conversion CAD one to one with each other. Therefore, the defect type is "non-defect".

For convenience, pieces of matrix type information as illustrated in FIGS. 14C and 14D are illustrated as information, which is prepared by the matching unit 208, of the correlation between the figure numbers. However, the embodiment is not limited thereto. Any information, in which the correlation between the figure numbers is prescribed, may be used.

A conversion CAD 524a, to which figure numbers D1 to D9 are given as illustrated in FIG. 15B, includes a wiring pattern which is not included as the wiring pattern in a design CAD 514 illustrated in FIG. 15A and which is specified using the figure number D9. In this case, a matrix, which indicates the correlation between the figure numbers prepared for the design CAD 514 and the conversion CAD 524a by the matching unit 208, is a matrix as illustrated in FIG. 15D. The matrix illustrated in FIG. 15D indicates that a wiring pattern corresponding to the wiring pattern indicated by the figure number D9 in the conversion CAD 524a does not exist in the design CAD 514, and a value of "Σ" in row corresponding to the figure number D9 of the conversion CAD 524a is 0. In this case, in subsequent step S135, the conversion CAD 524a is classified into the defect type "island".

In addition, a conversion CAD 524c, to which figure numbers D1 to D7 are given as illustrated in FIG. 15C, does not include a wiring pattern corresponding to the wiring pattern indicated by the figure number G7 in the design CAD 514 illustrated in FIG. 15A. In this case, a matrix, which indicates the correlation between the figure numbers prepared for the design CAD 514 and the conversion CAD 524*c* by the matching unit 208, is a matrix as illustrated in FIG. 15E. The matrix illustrated in FIG. 15E indicates that a wiring pattern corresponding to the wiring pattern indicated by the figure number G7 in the design CAD 514 does not exist in the conversion CAD 524*c*, and a value of "Σ" in column corresponding to the figure number G7 of the design CAD 514 is 0. In this case, in subsequent step S135, the conversion CAD 524*c* is classified into the defect type "missing".

In addition, a conversion CAD 524*b*, to which figure numbers D1 to D7 are given as illustrated in FIG. 16B, includes a wiring pattern indicated by the figure number D2 in which a wiring pattern indicated by a figure number G2 and a wiring pattern indicated by a figure number G3 are short-circuited (shorted) in a design CAD 514 illustrated in FIG. 16A. In this case, a matrix, which indicates a correlation between the figure numbers prepared for the design CAD 514 and the conversion CAD 524*b* by the matching unit 208, is a matrix as illustrated in FIG. 16D. The matrix illustrated in FIG. 16D indicates that two wiring patterns, which are indicated by the figure numbers G2 and G3, exist in the design CAD 514 as the wiring patterns corresponding to the wiring pattern indicated by the figure number D2 in the conversion CAD 524*b*, and a value of "Σ" in row corresponding to the figure number D2 of the conversion CAD 524*b* is a number greater than 1 (e.g., 2). In this case, in subsequent step S135, the conversion CAD 524*b* is classified into the defect type "short".

In addition, a conversion CAD 524*d*, to which figure numbers D1 to D9 are given as illustrated in FIG. 16C, shows a state in which the wiring pattern indicated by the figure number G2 in the design CAD 514 illustrated in FIG. 16A is divided into a wiring pattern indicated by the figure number D2 and a wiring pattern indicated by the figure number D8. In this case, a matrix, which indicates a correlation between the figure numbers prepared for the design CAD 514 and the conversion CAD 524*d* by the matching unit 208, is a matrix as illustrated in FIG. 16E. The matrix illustrated in FIG. 16E indicates that two wiring patterns, which are indicated by the figure numbers D2 and D8, exist in the conversion CAD 524*d* as a wiring pattern corresponding to the wiring pattern indicated by the figure number G2 in the design CAD 514, and a value of "Σ" in column corresponding to the figure number G2 of the design CAD 514 is a number greater than 1 (e.g., 2). In this case, in subsequent step S135, the conversion CAD 524*b* is classified into the defect type "open".

Returning to FIG. 11 and continuing the description. The process transitions to step S135 after matching is performed by the matching unit 208 in step S134.

(Step S135)

The classification unit 209 of the SEM apparatus 1 performs classification (determination) on a defect kind (defect type) of the wiring pattern of the conversion CAD based on a result of matching performed by the matching unit 208. An operation of the classification performed by the classification unit 209 will be described in detail later.

(Step S136)

The second giving unit 210 of the SEM apparatus 1 gives the node numbers to the respective wiring patterns of the design CAD based on the AGF acquired by the LVS execution unit 206. In addition, the circuit verification unit 211 of the SEM apparatus 1 determines whether or not the crucial defect exists on the circuit for the wiring patterns, which are indicated in the conversion CAD, based on the result of matching, which is performed by the matching unit 208 on the conversion CAD and the design CAD, and the node numbers which are given to the design CAD by the second giving unit 210. An operation of the circuit verification, which is performed by the second giving unit 210 and the circuit verification unit 211, will be described in detail later.

The defect inspection process in the SEM apparatus 1 is performed through the flow of above-described steps S131 to S136 shown in FIG. 11.

Figure 17:
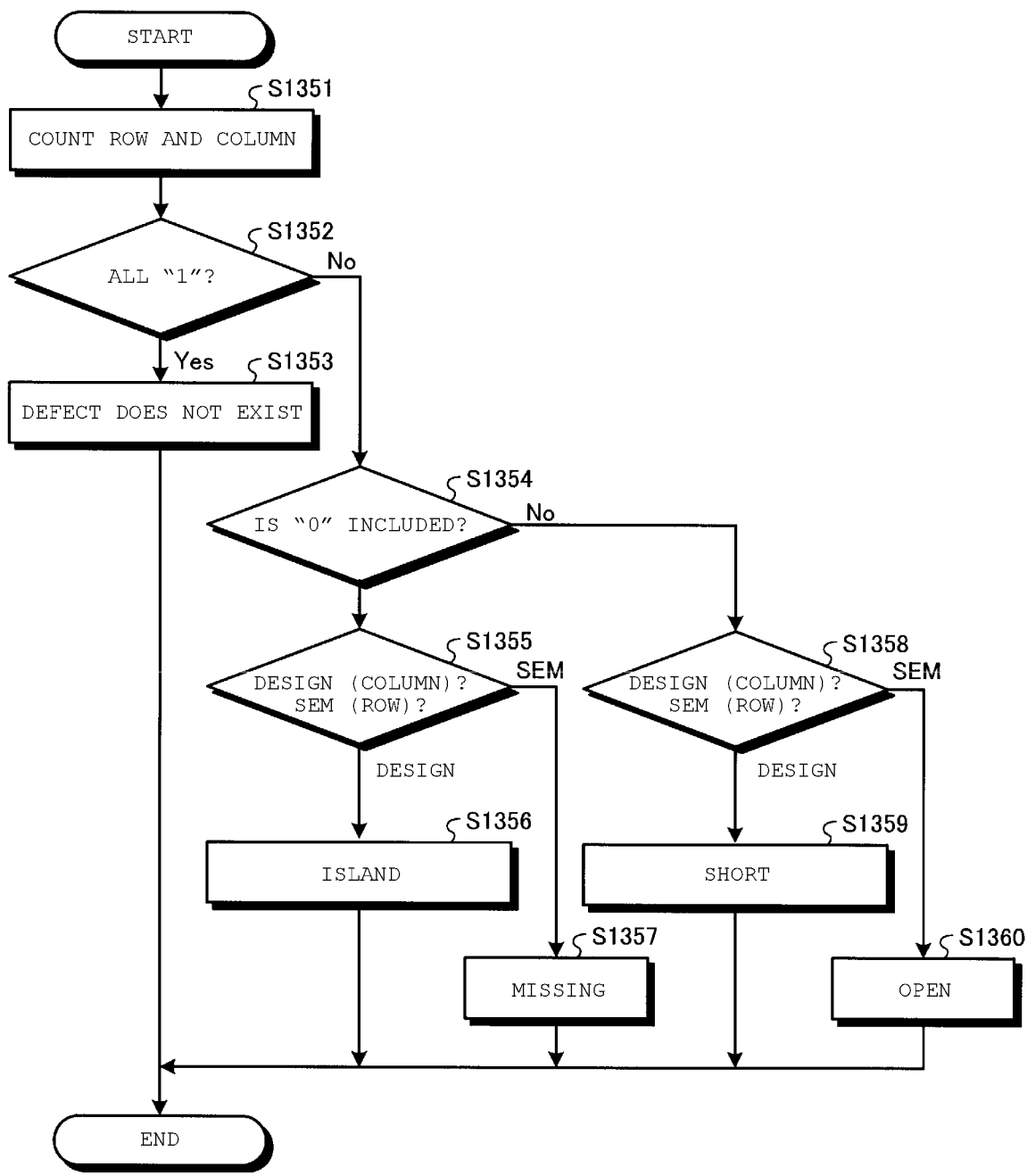
FIG. 17 is a flowchart illustrating defect type classification in the SEM apparatus according to the embodiment.

FIG. 17 is a flowchart illustrating the defect type classification performed by the SEM apparatus according to the embodiment. The flow of the defect type classification operation (step S135 of FIG. 11) of the defect inspection process in the SEM apparatus 1 according to the embodiment will be described with reference to FIG. 17.

(Step S1351)

The classification unit 209 of the SEM apparatus 1 counts "Σ" in row and "Σ" in column in the matrix which prescribes the correlation between the figure numbers in the design CAD and the conversion CAD, which are prepared by the matching unit 208. Thereafter, the process transitions to step S1352.

(Step S1352)

The classification unit 209 determines whether or not all the values of "Σ" in row and "Σ" in column are 1. When all the "Σ" are 1 (step S1352: Yes), the process transitions to step 1353. In a case where any of the values of "Σ" is not 1 (step S1352: No), the process transitions to step S1354.

(Step S1353)

When the classification unit 209 determines that all the values of "Σ" in row and "Σ" in column are 1 in the matrix which prescribes the correlation between the figure numbers, the classification unit 209 classifies the conversion CAD as the defect type "non-defect". Thereafter, the operation of the defect type classification ends.

(Step S1354)

When the classification unit 209 determines that any of "Σ" is not 1 in the matrix which prescribes the correlation between the figure numbers, the classification unit 209 further determines whether or not 0 is included in any of "Σ". When 0 is included in any of "Σ" (step S1354: Yes), the process transitions to step S1355. When 0 is not included (step S1354: No), the process transitions to step S1358.

(Step S1355)

The classification unit 209 further determines whether "Σ", which includes a value of 0, is "Σ" in row ("Σ" in "design (G)") or "Σ" in column ("Σ" in "SEM(D)"). When "Σ", which includes a value of 0, is "Σ" in row ("Σ" in "design (G)") (step S1355: design), the process transitions to step S1356. When "Σ", which includes a value of 0, is "Σ" in column ("Σ" in "SEM(D)") (step S1355: SEM), the process transitions to step S1357.

(Step S1356)

The classification unit 209 classifies the conversion CAD as the defect type "island". For example, when the matrix as illustrated in FIG. 15D is prepared for the conversion CAD 524*a* illustrated in the above-described FIG. 15B by the matching unit 208, the classification unit 209 classifies the conversion CAD 524*a* as the defect type "island". Furthermore, the operation of performing the classification on the defect type ends.

(Step S1357)

The classification unit 209 classifies the conversion CAD as the defect type "missing". For example, when the matrix as illustrated in FIG. 15E is prepared for the conversion CAD 524*c* illustrated in the above-described FIG. 15C by the matching unit 208, the classification unit 209 classifies the conversion CAD 524c as the defect type "missing". Furthermore, the operation of performing the classification on the defect type ends.

(Step S1358)

The classification unit 209 further determines whether "Σ", in which a value is not 0 and is not 1, that is, a value is equal to or larger than 2, is "Σ" in row ("Σ" in "design (G)") or "Σ" in column ("Σ" in "SEM(D)). When "Σ" which includes the value that is equal to or larger than 2 is "Σ" in row ("Σ" in "design (G)") (step S1358: design), the process transitions to step S1359. When "Σ" which includes the value that is equal to or larger than 2 is "Σ" in column ("Σ" in "SEM(D)) (step S1358: SEM), the process transitions to step S1360.

(Step S1359)

The classification unit 209 classifies the conversion CAD as the defect type "short". For example, when the matrix as illustrated in FIG. 16D is prepared for the conversion CAD 524b illustrated in the above-described FIG. 16B by the matching unit 208, the classification unit 209 classifies the conversion CAD 524b as the defect type "short". Furthermore, the operation of performing the classification on the defect type ends.

(Step S1360)

The classification unit 209 classifies the conversion CAD as the defect type "open". For example, when the matrix as illustrated in FIG. 16E is prepared for the conversion CAD 524d illustrated in the above-described FIG. 16C by the matching unit 208, the classification unit 209 classifies the conversion CAD 524d as the defect type "open". Furthermore, the operation of performing the classification on the defect type ends.

The defect inspection process in the SEM apparatus 1 is performed through the flow of above-described steps S1351 to S1360. In some embodiments, the classification unit 209 may generate and/or transmit a classification result of the classification process that indicates the determined defect type. For example, following (or as part of) step S1353, step S1356, step S1357, step S1359, or step S1360, in which the classification unit 209 determines the defect type, the classification unit 209 may transmit a classification result to an external device. For example, the external device may be the monitor 33, and the classification unit 209 may transmit the classification result for display (e.g., as a text or graphical indication) on the monitor 33. By way of further example, the external device may be a speaker device, and the classification unit 209 may transmit the classification result for audio notification of the classification result (e.g., as a voice indicating the classification result or as another audio signal indicating the classification result). The external device may be a device that makes use of the classification result (e.g., may be a device that uses the classification result to determine whether or not the classified patterns constitute a crucial defect).

Figure 18:
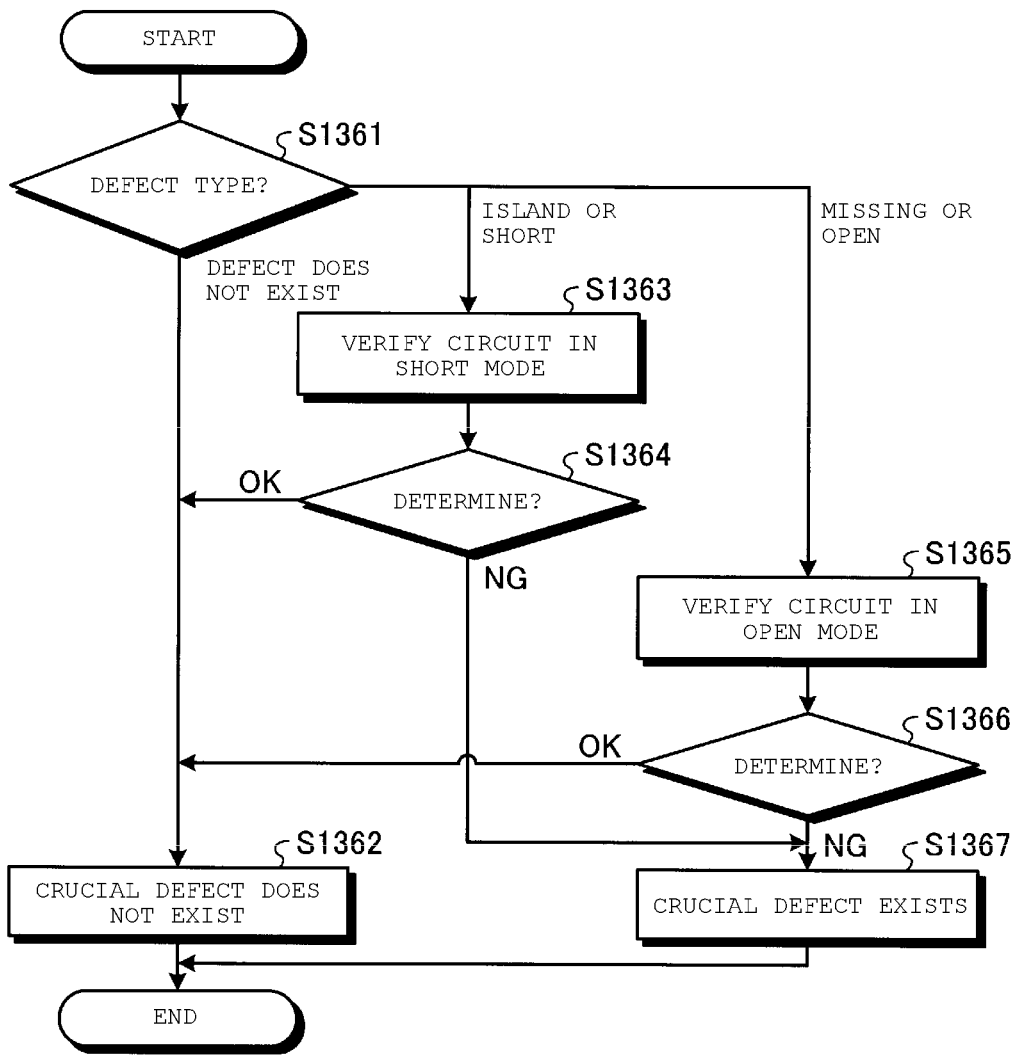
FIG. 18 is a flowchart illustrating circuit verification in the SEM apparatus according to the embodiment.
Figure 20A:
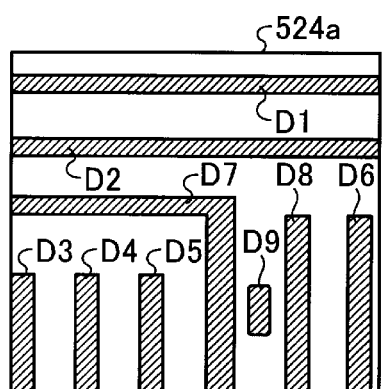
FIGS. 20A to 20C are diagrams illustrating the circuit verification in the SEM apparatus according to the embodiment.
Figure 20B:
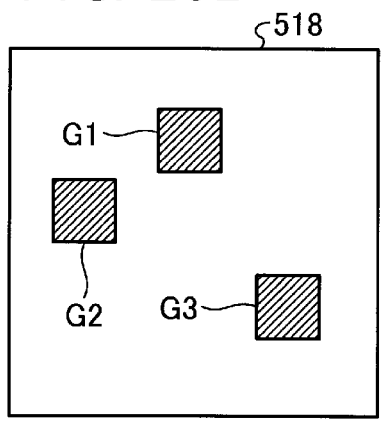
Figure 20C:
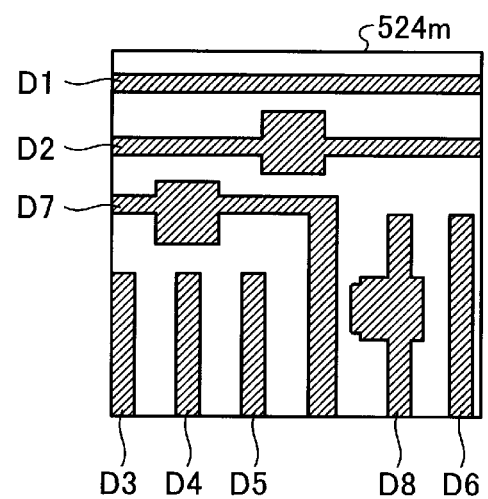

FIG. 18 is a flowchart illustrating the circuit verification in the SEM apparatus according to the embodiment. FIGS. 19A to 19E are diagrams illustrating the circuit verification in the SEM apparatus according to the embodiment. FIGS. 20A to 20C are diagrams illustrating the circuit verification in the SEM apparatus according to the embodiment. FIGS. 21A to 21C are diagrams illustrating the circuit verification in the SEM apparatus according to the embodiment. FIGS. 22A to 22C are diagrams illustrating the circuit verification in the SEM apparatus according to the embodiment. A flow of a circuit verification operation (step S136 of FIG. 11) of the defect inspection process in the SEM apparatus 1 according to the embodiment will be described with reference to FIGS. 18 to 22C.

(Step S1361)

The circuit verification unit 211 of the SEM apparatus 1 checks whether or not the conversion CAD, which is the target of the defect inspection process, is classified into any of the defect type by the classification unit 209. When the conversion CAD is classified into the defect type "non-defect" (step S1361: non-defect), the process transitions to step S1362. When the conversion CAD is classified into the defect type "island" or "short" (step S1361: island or short), the process transitions to step S1363. When the conversion CAD is classified into the defect type "missing" or "open" (step S1361: missing or open), the process transitions to step S1365.

(Step S1362)

The circuit verification unit 211 determines that the crucial defect does not exist on the circuit on the chip corresponding to the conversion CAD. The circuit verification unit 211 may generate and/or transmit a verification result of the verification process that indicates whether the crucial defect exists on the circuit of the chip. For example, following (or as part of) step 1362 in which the circuit verification unit 211 determines that the crucial defect does not exist on the circuit of the chip, the circuit verification unit 211 may transmit a verification result to an external device. For example, the external device may be the monitor 33, and the circuit verification unit 211 may transmit the verification result for display (e.g., as a text or graphical indication) on the monitor 33. By way of further example, the external device may be a speaker device, and the circuit verification unit 211 may transmit the verification result for audio notification of the verification result (e.g., as a voice indicating the verification result or as another audio signal indicating the verification result). The external device may be a device that makes use of the verification result (e.g., may be a device that implements an approval or further processing process (e.g., a packaging process) for the chip having the circuit for which no crucial defect exists, based on the verification result). Thereafter, the circuit verification operation ends.

(Step S1363)

The second giving unit 210 and the circuit verification unit 211 of the SEM apparatus 1 perform the circuit verification in a short mode. For example, here, description is performed while it is assumed that the conversion CAD is classified into the defect type "short" in step S1361.

A design CAD 514 illustrated in FIG. 19A shows a state in which the figure numbers G1 to G8 are given in step S133 illustrated in the above-described FIG. 11. A conversion CAD 524b illustrated in FIG. 19B shows a state in which the figure numbers D1 to D7 are given in step S133, similarly. A matrix illustrated in FIG. 19C is a matrix, which indicates the correlation between the figure numbers prepared by the matching unit 208 for the design CAD 514 and the conversion CAD 524b in step S134 illustrated in the above-described FIG. 11.

In addition, as described above, when the defect inspection process is performed, the LVS is previously performed by the LVS execution unit 206 between the schematic data and the design CAD data corresponding to the chip, and the AGF is acquired. Therefore, the respective wiring patterns in the design CAD 514 correlate with the node numbers. Therefore, the second giving unit 210 gives the node numbers to the respective wiring patterns of the design CAD 514 based on the AGF acquired by the LVS execution unit 206.

It is assumed that a state, in which the node numbers A1 to A6 are given to the design CAD 514, corresponds to a design CAD 514a illustrated in FIG. 19D.

The circuit verification unit 211 prepares a matrix illustrated in FIG. 19E which illustrates the correlation between the figure numbers G1 to G8 of the design CAD 514 and the node numbers A1 to A6 of the design CAD 514a. Furthermore, the circuit verification unit 211 specifies that the wiring pattern, which is indicated by the figure number D2 and is in the state "short" in the conversion CAD 524b, corresponds to the wiring patterns indicated by the figure numbers G2 and G3 in the design CAD 514 with reference to the matrix illustrated in FIG. 19C prepared by the matching unit 208. Furthermore, the circuit verification unit 211 checks the node numbers of the wiring patterns in the design CAD 514a, which correspond to the wiring patterns indicated by the figure numbers G2 and G3 of the design CAD 514, with reference to the prepared matrix illustrated in FIG. 19E.

In a case of the matrix illustrated in FIG. 19E, the circuit verification unit 211 can check that the node numbers of the wiring patterns in the design CAD 514a, which correspond to the wiring patterns indicated by the figure numbers G2 and G3 of the design CAD 514, are A1 and A2, respectively. Therefore, the circuit verification unit 211 determines that the short-circuited (shorted) wiring pattern, which is indicated by the figure number D2, short-circuits the wiring patterns indicated by different node numbers in the conversion CAD 524b which shows an actual circuit state, and thus a defect exists on the circuit (determination NG).

In contrast, when the circuit verification unit 211 checks that, in the conversion CAD 524b, the short-circuited (shorted) wiring pattern, which is indicated by the figure number D2, short-circuits the wiring pattern indicated by the same node number, the circuit verification unit 211 determines that a defect does not exist on the circuit (determination OK).

In addition, when the conversion CAD is classified into the defect type "island" in step S1361, the circuit verification unit 211 determines that the wiring pattern, which corresponds to the wiring pattern (for example, the wiring pattern indicated by the figure number D9 in the conversion CAD 524a) that undesirably (e.g., redundantly) exists in, for example, the conversion CAD (for example, conversion CAD 524a) which shows the actual circuit state and to which node number in the design CAD 514a is given, does not exist. Therefore, the circuit verification unit 211 may determine that the defect does not exist on the circuit (determination OK).

When the conversion CAD is classified into the defect type "island" in step S1361, the following process may be performed. That is, first, in a figure indicated by the design CAD data of the chip acquired by the second acquisition unit 202, the conversion CAD (for example, a conversion CAD 524a illustrated in FIG. 20A) is acquired by the conversion unit 204. Here, the figure numbers D1 to D9 are given to the respective wiring patterns in the conversion CAD 524a. Subsequently, in the figure indicated by the CAD data, a portion corresponding to the conversion CAD 524a is replaced by the conversion CAD 524a (replacement CAD) by the replacement unit 205. As illustrated in FIG. 20B, a design CAD 518, which shows via hole patterns G1 to G3 (wirings which connect an upper layer wiring to a lower layer wiring) that exist at the same portions as in the conversion CAD 524a, is extracted based on the replacement CAD. Furthermore, as illustrated in FIG. 20C, the design CAD 518 is synthesized with the conversion CAD 524a, and thus a conversion CAD 524m, in which the wiring patterns are synthesized with the via hole patterns, is prepared. Subsequently, similarly to step S133, the first giving unit 207 gives the figure numbers D1 to D8 again with respect to respective patterns of the conversion CAD 524m. Thereafter, the circuit verification unit 211 performs the circuit verification similarly to the case where classification as the defect type "short" is performed. Based on a result of the classification, the circuit verification unit 211 may determine that the defect does not exist on the circuit (determination OK) or the defect exists on the circuit (determination NG).

Thereafter, the process transitions to step S1364.

(Step S1364)

When step S1364 returns on "OK" determination by the circuit verification unit 211 (step S1364: OK), the process transitions to step S1362. In a case where it is determined to be NG (step S1364: NG), the process transitions to step S1367.

(Step S1365)

The second giving unit 210 and the circuit verification unit 211 of the SEM apparatus 1 perform the circuit verification in an open mode. For example, here, description is performed while it is assumed that the conversion CAD is classified into the defect type "open" in step S1361.

A design CAD 514 illustrated in FIG. 21A illustrates a state in which the figure numbers G1 to G8 are given in step S133 illustrated in the above-described FIG. 11. Similarly, a conversion CAD 524d illustrated in FIG. 21B illustrates a state in which the figure numbers D1 to D9 are given in step S133. A matrix illustrated in FIG. 21C is a matrix which indicates the correlation between the figure numbers prepared by the matching unit 208 for the design CAD 514 and the conversion CAD 524d in step S134 illustrated in the above-described FIG. 11. In addition, as described above, the respective wiring patterns in the design CAD 514 correlate with the node numbers. Therefore, the second giving unit 210 gives the node numbers to the respective wiring patterns of the design CAD 514 based on the AGF acquired by the LVS execution unit 206. A state in which the node numbers A1 to A6 are given to the design CAD 514 is assumed as the design CAD 514a illustrated in FIG. 19D, as described above.

The circuit verification unit 211 prepares the matrix as illustrated in the above-described FIG. 19E which illustrates the correlation between the figure numbers G1 to G8 of the design CAD 514 and the node numbers A1 to A6 of the design CAD 514a. The circuit verification unit 211 refers to the matrix which is prepared by the matching unit 208 and is illustrated in FIG. 21C, and specifies that the wiring patterns indicated by the figure numbers D2 and D8, which are in the "open" state in the conversion CAD 524d, correspond to the wiring pattern indicated by the figure number G2 of the design CAD 514. Furthermore, the circuit verification unit 211 refers to the prepared matrix illustrated in FIG. 19E, and checks the node number of the wiring pattern, which corresponds to the wiring pattern indicated by the figure number G2 of the specified design CAD 514, in the design CAD 514a. In the examples illustrated in FIGS. 21A to 21C, the circuit verification unit 211 can check that the node number of the wiring pattern, which corresponds to the wiring pattern indicated by the figure number G2 of the design CAD 514, in the design CAD 514a is A2. However, in this case, the circuit verification unit 211 does not determine whether the wiring patterns, which are open and are indicated by the figure numbers D2 and the D8 in the conversion CAD 524d that shows the actual circuit state, are improperly connected (short-circuited) at another spot of the chip.

In this case, as illustrated in FIG. 22A, the replacement unit 205 of the SEM apparatus 1 replaces a portion, which corresponds to a conversion CAD 524d acquired through conversion performed by the conversion unit 204, in a figure shown by the design CAD data of the chip acquired by the second acquisition unit 202, by the conversion CAD 524d. Furthermore, the replacement unit 205 extracts a portion, which corresponds to a predetermined range including the conversion CAD 524d, as a replacement CAD 534 (an example of replacement information) from the CAD data which is replaced by the conversion CAD 524d. Respective wiring patterns of the replacement CAD 534 (including the conversion CAD 524d) correlate with respective node numbers as described above. The wiring patterns indicated by the figure numbers D2 and D8, which are determined that defect (open) exists in the conversion CAD 524d, are specified. Therefore, even when the LVS is not performed using the CAD data of the chip, it is possible to determine that the crucial defect actually exists on the circuit if the LVS is performed for a portion of the predetermined range including the conversion CAD 524d as described above. Furthermore, the LVS execution unit 206 performs the LVS between the schematic data and the replacement CAD 534 that is the portion of the predetermined range including the replaced conversion CAD 524d in the CAD data of the chip. In some embodiments, the predetermined range is a range which includes the wiring patterns, which are indicated by the figure numbers D2 and D8 and determined that the defect (open) exists, in the conversion CAD 524d and a figure which belongs to the node number A2 specified by the matching unit 208 and the circuit verification unit 211. Since it is possible to reduce the number of figures, between processing of which the LVS is performed, based on the node numbers, it is possible to reduce inspection time.

An example case is taken into a consideration where a fact that the wiring pattern indicated by the figure number D2 is improperly connected (e.g., short circuited) with the wiring pattern indicated by the figure number D8 is detected in a figure included in the design CAD that configures the node number A2, which has the open defect and which corresponds to the figure number D2 and D8, that is, in a circuit portion other than the conversion CAD 524d, as illustrated in FIG. 22B. In this case, it is possible for the circuit verification unit 211 to determine that the wiring patterns, which are indicated by the figure numbers D2 and D8 and are determined to be in the open state, correspond to the wiring pattern indicated by the same node number in the conversion CAD 524d which shows the actual circuit state. In this case, it is determined that the defect does not exist on the circuit (determination OK).

In contrast, as a result of the LVS (e.g., based on a trace through the LVS) performed by the LVS execution unit 206, for example, a case is taken into a consideration where a fact that the wiring pattern indicated by the figure number D2 is not improperly connected (e.g., short circuited) with the wiring pattern indicated by the figure number D8 is detected in the figure included in the design CAD that configures the node number A2, which has the open defect and which corresponds to the figure number D2 and D8, that is, in a circuit portion other than the conversion CAD 524d, as illustrated in FIG. 22C. In this case, it is possible for the circuit verification unit 211 to determine that, in the conversion CAD 524d which shows the actual circuit state, the wiring patterns, which are indicated by the figure numbers D2 and D8 and are determined to be in the open state, correspond to wiring patterns indicated by different node numbers. In this case, it is determined that the defect exists on the circuit (determination NG).

In addition, when the conversion CAD is classified into the defect type "missing" in step S1361, the circuit verification unit 211 checks that, for example, a wiring pattern, which corresponds to the wiring pattern indicated by the node number A6 of the design CAD 514a, does not exist in the conversion CAD (for example, the conversion CAD 524c illustrated in FIG. 13D) which shows the actual circuit state. In this case, the circuit verification unit 211 does not determine an influence of the wiring pattern, which does not exist on the conversion CAD 524c that is classified into "missing", to be applied to the circuit of the chip in the conversion CAD 524c which shows the actual circuit state.

Similarly, the replacement unit 205 replaces a portion, which corresponds to the conversion CAD 524c acquired through conversion performed by the conversion unit 204, by the conversion CAD 524c in the figure indicated by the design CAD data acquired by the second acquisition unit 202, and extracts the replacement CAD which corresponds to the replacement CAD 534 illustrated in FIG. 22A. Furthermore, the LVS execution unit 206 performs the LVS between the schematic data and a portion of the predetermined range which includes the replaced conversion CAD 524c in the CAD data of the chip. In some embodiments, the predetermined range is a range which includes a figure that belongs to the node number A6 specified by the figure number G7 in the design CAD 514 corresponding to the conversion CAD 524c.

A case is taken into consideration where, as a result the LVS (e.g., based on a trace of the LVS) performed by the LVS execution unit 206, a fact that a portion, which is not improperly connected (e.g., short circuited) in a circuit configured with the wiring pattern indicated by the node number A6, does not exist is detected, for example, in the replacement CAD, that is, a circuit portion other than the conversion CAD 524c. In this case, it is possible for the circuit verification unit 211 to determine that a fact that the wiring pattern, which corresponds to the node number A6, does not exist does not negatively impact the circuit in a significant manner in the conversion CAD 524c which shows the actual circuit state. In this case, it is determined that the defect does not exist on the circuit (determination OK).

In contrast, a case is taken into consideration where, as the result of the LVS (e.g., based on a trace of the LVS) performed by the LVS execution unit 206, a fact that a portion, which is not improperly connected (e.g., short circuited) in the circuit configured with the wiring pattern indicated by the node number A6, exists is detected in the replacement CAD, that is, the circuit portion other than the conversion CAD 524c. In this case, it is possible for the circuit verification unit 211 to determine that a fact that the wiring pattern, which corresponds to the node number A6, does not exist negatively impacts the circuit in a significant manner in the conversion CAD 524c which shows the actual circuit state. In this case, it is determined that the defect exists on the circuit (determination NG).

Thereafter, the process transitions to step S1366.

(Step S1366)

When it is determined to be OK by the circuit verification unit 211 (step S1366: OK), the process transitions to step S1362. When it is determined to be NG (step S1366: NG), the process transitions to step S1367.

(Step S1367)

The circuit verification unit 211 determines that the crucial defect exists on the circuit of the chip corresponding to the conversion CAD. The circuit verification unit 211 may generate and/or transmit a verification result of the verification process that indicates whether the crucial defect exists on the circuit of the chip. For example, following (or as part of) step 1367 in which the circuit verification unit 211 determines that the crucial defect exists on the circuit of the chip, the circuit verification unit 211 may transmit a verification result to an external device. For example, the external device may be the monitor 33, and the circuit verification unit 211 may transmit the verification result for display (e.g., as a text or graphical indication) on the monitor 33. By way of further example, the external device may be a speaker device, and the circuit verification unit 211 may transmit the verification result for audio notification of the verification result (e.g., as a voice indicating the verification result or as another audio signal indicating the verification result). The external device may be a device that makes use of the verification result (e.g., may be a device that implements a repair or a disposal process for the chip having the defective circuit, based on the verification result). Furthermore, the circuit verification unit 211 ends the circuit verification operation.

As described above, in the SEM apparatus 1 according to the embodiment, the figure numbers are given to the respective wiring patterns of the conversion CAD and the design CAD, correlation (matching) is performed using the respective figure numbers, and the defect type of the conversion CAD is classified based on a result of the correlation. Furthermore, the node numbers are given to the wiring patterns of the design CAD, it is determined whether or not the defect exists on the circuit using the conversion CAD which shows the actual circuit state based on a result of the correlation between the figure numbers and the node numbers of the design CAD. In the defect inspection process, it is not necessary to perform the LVS between, for example, the schematic data and the design CAD data of the chip, and thus it is possible to reduce the inspection time in the defect inspection during manufacturing of the semiconductor.

In addition, in the SEM apparatus 1 according to the embodiment, for example, when the defect type of the conversion CAD is classified into "short" or "island", it is determined whether or not the defect exists on the circuit through the conversion CAD which shows the actual circuit state based on the result of the correlation between the figure numbers of the design CAD and the conversion CAD and the result of the correlation between the figure numbers and the node numbers in the design CAD. In this case, since it is possible to determine whether or not the defect exists on the circuit without performing the LVS, it is further possible to shorten the inspection time.

In addition, in the SEM apparatus 1 according to the embodiment, for example, when the defect type of the conversion CAD is classified into "open" or "missing", a portion, which corresponds to the conversion CAD acquired through conversion performed by the conversion unit 204, is replaced by the conversion CAD in the figure indicated by the design CAD data of the chip, and the portion of the predetermined range, which includes the conversion CAD, is extracted as the replacement CAD from the replaced CAD data. Thereafter, the LVS is performed between the schematic data and the replacement CAD corresponding to the portion of the predetermined range which includes the replaced conversion CAD in the CAD data of the chip, and it is determined whether or not the defect exists on the circuit using the conversion CAD which shows the actual circuit state. In this case, even when the LVS is performed, it is possible to set the CAD data corresponding to a target of the LVS to a limited range, and thus it is possible to reduce the inspection time.

A process of an execution target, which is performed by the LVS execution unit 206, is not limited to the LVS, and, for example, a process of performing an equipotential trace may be provided in addition to the process for acquiring AGF. In addition, although the defect inspection process is performed using the conversion CAD, which is acquired by converting the SEM image into the CAD data, and the design CAD, which is acquired by clipping a portion corresponding to the SEM image from the design CAD data, the defect inspection process may be performed using the image data instead of the CAD data. For example, instead of the conversion CAD, the SEM image or an image, which is acquired by performing image processing suitable for the defect inspection process from the SEM image, may be used.

Modification Example

An operation, which is different from the above-described SEM apparatus 1 according to the embodiment, will be described mainly. In the above-described embodiment, the defect inspection process using the SEM image for the circuit patterns (wiring patterns) is described. In the modification example, a defect inspection process using an SEM image for a via hole, which connects circuit patterns on different layers will be described. Since a configuration of an SEM apparatus according to the modification example is the same as, or similar to, the configuration of the above-described the SEM apparatus 1 according to the embodiment, the same reference symbols are attached to the respective devices, circuits, functional units, and the like.

FIGS. 23A to 23E are diagrams illustrating defect types in the SEM apparatus according to the modification example of the embodiment. The defect types classified through the defect type classification in an SEM apparatus 1 according to the modification example will be described with reference to FIGS. 23A to 23E.

A design CAD 515 illustrated in FIG. 23A is a portion of a figure indicated by design CAD data corresponding to the SEM image for the via holes clipped by the clip unit 203, and figure numbers G1 to G3 are given by the first giving unit 207. In addition, figures illustrated in FIGS. 23B to 23D indicate the conversion CADs which are converted into the CAD data from the SEM image for the via holes by the conversion unit 204. Figure numbers D1 to D4 are given to a conversion CAD 525*a* illustrated in FIG. 23B, and a via hole indicated by the figure number D4 undesirably (e.g., redundantly) exists, compared to the design CAD 515. Therefore, the conversion CAD 525*a* is classified into the defect type "island". Figure numbers D1 and D2 are given to a conversion CAD 525*b* illustrated in FIG. 23C, and the conversion CAD 525*b* has a via hole, which is indicated by the figure number D1 and which is acquired in such a way that a via hole indicated by the figure number G1 and a via hole indicated by the figure number G3 in the CAD 515 are short-circuited (shorted). Therefore, the conversion CAD 525*b* is classified into the defect type "short".

Figure numbers D1 are D2 are given to a conversion CAD 525*c* illustrated in FIG. 23D, and the via hole indicated by the figure number G3 does not exist in the design CAD 515. Therefore, the conversion CAD 525*c* is classified into the defect type "missing". Figure numbers D1 are D2 are given to a conversion CAD 525*d* illustrated in FIG. 23E, and the via hole indicated by the figure number G3 does not exist in the design CAD 515. Therefore, it is assumed that a wiring pattern on an upper layer and a wiring pattern on a lower layer, which are to be connected through an originally existing via hole, are at an open state. Thus, the conversion CAD 525*d* is classified into the defect type "open". When the SEM image of the via holes is acquired, generation of secondary electrons from the via holes, such as an open via hole, which is not improperly connected (e.g., short circuited) with the lower layer, is significantly lowered due to electrification during imaging, and thus the same or a similar conversion CAD is acquired, as illustrated in FIGS. 23D and 23E.

FIGS. 24A to 24E are diagrams illustrating circuit verification in the SEM apparatus according to the modification example of the embodiment. A circuit verification operation of the defect inspection process in the SEM apparatus 1 according to the modification example will be described with reference to FIGS. 24A to 24E.

Here, description will be performed while it is assumed that the conversion CAD is classified into the defect type "island" in above-described step S1361 of FIG. 18. However, a case where a via hole, which does not exist in the design CAD, exists in the conversion CAD for the via hole, corresponds to the defect type having a property in which there is a possibility that the wiring pattern on the upper layer is improperly connected (shorted) to the wiring pattern on the lower layer, and thus the circuit verification may be performed when the above-described conversion CAD illustrated in FIG. 19B is classified into the defect type "short".

A lower layer CAD 516*a* illustrated in FIG. 24A indicates a state in which figure numbers G1 to G8 are given with respect to a design CAD on the lower layer in the above-described step S133 illustrated in FIG. 11. Similarly, a lower layer CAD 516*b* illustrated in FIG. 24C indicates a state in which figure numbers G1 and G2 are given with respect to a design CAD on the upper layer in step S133. Similarly, a conversion CAD 526 illustrated in FIG. 24B indicates a state in which the figure numbers D1 to D4 are given in step S133. In addition, as described above, when the defect inspection process is performed, the LVS is previously performed between the schematic data and the design CAD data corresponding to the chip by the LVS execution unit 206, and the AGF is acquired. Therefore, the node numbers correlate with the respective wiring patterns in the design CAD on the lower layer and the upper layer. Accordingly, the second giving unit 210 gives the node numbers to the respective wiring patterns in the design CADs on the lower layer and the upper layer based on the AGF acquired by the LVS execution unit 206. It is assumed that a state in which the node numbers A1 to A6 are given to the design CAD on the lower layer is a lower layer CAD 517*a* illustrated in FIG. 24D. It is assumed that a state in which the node numbers A1 and A6 are given to the design CAD on the upper layer is the upper layer CAD 517*b* illustrated in FIG. 24E.

The circuit verification unit 211 prepares a matrix, as illustrated in FIG. 24F, which illustrates the correlation between the figure numbers of the lower layer CAD 516*a* and the upper layer CAD 516*b* with the node numbers of the lower layer CAD 517*a* and the upper layer CAD 517*b*. Furthermore, the circuit verification unit 211 specifies that a via hole indicated by the figure number D4 at an "island" state connects (short-circuits) the via hole indicated by the figure number G2 on the lower layer CAD 516*a* and the via hole indicated by the figure number G2 of the upper layer CAD 516*b* in the conversion CAD 526. Furthermore, the circuit verification unit 211 checks the node numbers of the via holes in the lower layer CAD 517*a* and the upper layer CAD 517*b*, which correspond to the specified via hole indicated by the figure number G2 of the lower layer CAD 516*a* and the node number of the via hole corresponding to the via hole of the figure number G2 on the upper layer CAD 516*b*, with reference to the prepared matrix illustrated in FIG. 24F. In the case of the matrix illustrated in FIG. 24F, it is possible for the circuit verification unit 211 to check that the node numbers of the via holes, which correspond to the respective via holes indicated by the figure number G2 on the lower layer CAD 516*a* and the figure number G2 on the upper layer CAD 516*b* in the lower layer CAD 517*a* and the upper layer CAD 517*b*, are A2 and A6. Therefore, the circuit verification unit 211 determines that the short-circuited (shorted) via hole indicated by the figure number D4 short-circuits a via hole indicated by a different node number in the conversion CAD 526, which indicates an actual state of the via hole, and the defect exists on the circuit (determination NG).

In contrast, when the circuit verification unit 211 checks that the short-circuited (shorted) via hole indicated by the figure number D4 short-circuits a via hole indicated by the same node number in the conversion CAD 526, the circuit verification unit 211 determines that the defect does not exist on the circuit (determination OK).

Even when the conversion CAD is classified into the defect type "short" in above-described step S1361 of FIG. 18, it is possible to determine whether or not the defect exists on the circuit, similar to the above description.

When the conversion CAD is classified into the defect type "open" or "missing" in step S1361 of the above-described FIG. 18, a process (e.g., a process for performing the LVS using the replacement CAD in the predetermined range), which is the same as the process in step S1365 of the above-described FIG. 18, may be performed.

As described above, in the SEM apparatus 1 according to the modification example, the figure numbers are given to the respective via holes of the conversion CAD and the design CAD, the correlation (matching) is performed using the respective figure numbers, and classification is performed on the defect type of the conversion CAD based on the result of the correlation. Furthermore, the node numbers are given to the via holes of the design CAD, and it is determined whether or not the defect exists on the circuit using the conversion CAD which shows the actual circuit state based on the result of the correlation between the figure numbers and the node numbers of the design CAD. In the defect inspection process, it is not necessary to perform the LVS between, for example, the schematic data and the design CAD data of the chip. Therefore, during the manufacturing of the semiconductor, it is possible to reduce the inspection time in the defect inspection.

In addition, in the SEM apparatus 1 according to the modification example, when the defect type of the conversion CAD is classified into, for example, "short" or "island", it is determined whether or not the defect exists on the circuit using the conversion CAD which shows the actual circuit state based on the result of the correlation between the figure numbers of the design CAD and the conversion CAD and the result of the correlation between the figure numbers and the node numbers in the design CAD. In this case, it is possible to determine whether or not the defect exists on the circuit without performing the LVS, and thus, it is further possible to reduce the inspection time.

In addition, in the SEM apparatus 1 according to the modification example, when the defect type of the conversion CAD is classified into, for example, "open" or "missing", the portion corresponding to the conversion CAD, which is acquired through conversion performed by the conversion unit 204, is replaced by the conversion CAD in the figure indicated by the design CAD data of the chip, and the portion of the predetermined range including the conversion CAD is extracted as the replacement CAD from the replaced CAD data. Thereafter, the LVS is performed between the schematic data and the replacement CAD, which is the portion of the predetermined range that includes the replaced conversion CAD among the CAD data of the chip, and it is determined whether or not the defect exists on the circuit using the conversion CAD which shows the actual circuit state. In this case, although the LVS is performed, it is possible to set the CAD data, which is a target on which the LVS is performed, to a limited range, and thus it is possible to reduce the inspection time.

The program, which is executed in the SEM apparatus according to the above-described embodiment and the modification example, may be provided by being previously embedded in, for example, the ROM or the like, or otherwise stored in machine-readable media.

In addition, the program, which is executed in the SEM apparatus 1 according to the above-described embodiment and the modification example, may be configured to be recorded in a computer-readable recording medium, such as a Compact Disc-Read Only Memory (CD-ROM), a flexible Disk (FD), a Compact Disc-Recordable (CDR), or a Digital Versatile Disc (DVD), as a file in an installable format or an executable format, or otherwise stored in machine-readable media, and may be provided as a computer program product.

In addition, the program, which is executed in the SEM apparatus 1 according to the above-described embodiment and the modification example, may be configured to be stored in a computer which is connected to a network, such as the Internet, and to be provided through downloading via the network. In addition, the program, which is executed in the SEM apparatus 1 according to the above-described embodiment and the modification example, may be configured to be provided or distributed via the network, such as the Internet.

In addition, the program, which is executed in the SEM apparatus 1 according to the above-described embodiment and the modification example, may cause the computer (or components thereof) to function as each of the above-described functional units. In the computer, the CPU may read the program from the computer-readable storage medium and execute the program on a main storage device.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An apparatus for inspecting a defect, the apparatus comprising:
a memory storage; and
a processing unit coupled to the memory storage, wherein the processing unit is configured to:
acquire pattern data indicative of one or more patterns implemented on a wafer from a storage device,
clip a portion that corresponds to the pattern data from a figure indicated by design data to generate design information that indicates one or more circuit patterns,
respectively assign a first set of numbers to each of the one or more patterns indicated by the pattern data,
respectively assign a second set of numbers to each of the one or more circuit patterns indicated by the design information,
generate relation information indicative of one or more correspondences between the first set of numbers and the second set of numbers,
verify whether or not the one or more patterns indicated by the pattern data constitute a crucial defect in a circuit of the wafer based on the relation information to generate a verification result,
send the verification result to a device,
acquire conversion information by converting the pattern data into Computer Aided Design (CAD) data, the conversion information indicating the one or more patterns implemented on the wafer,
assign the first set of numbers to the one or more patterns indicated by the conversion information, and
verify whether or not the one or more patterns indicated by the conversion information constitute the crucial defect in the circuit of the wafer, based on the relation information.

2. The apparatus according to claim 1, wherein the processing unit is configured to:
perform classification of a defect type for the conversion information based on the relation information, and
verify whether or not the one or more patterns indicated by the conversion information includes the crucial defect in the circuit of the wafer according to the defect type for which the classification is performed.

3. The apparatus according to claim 2, wherein the processing unit is configured to:
respectively assign node numbers to each of the circuit patterns indicated by the design information, and
verify whether or not the one or more patterns indicated by the conversion information constitute the crucial defect in the circuit of the wafer based on the relation information and the node numbers.

4. The apparatus according to claim 3, wherein the processing unit is configured to specify, when the defect type of the conversion information indicates a short-circuit state, based on the relation information, one of the circuit patterns indicated by the design information which corresponds to a pattern in the short-circuit state in the design information, and verify whether or not the one or more patterns indicated by the conversion information constitute the crucial defect in the circuit of the wafer based on a corresponding relation between the specified pattern in the design information and one of the node numbers.

5. The apparatus according to claim 3, wherein the processing unit is configured to:
replace a portion of the figure indicated by the design data corresponding to conversion information by the conversion information to generate a modified figure,
extract a portion of the modified figure in a predetermined range which includes the conversion information as replacement information,
perform Layout Versus Schematic (LVS) verification between schematic data of the wafer and at least some of the design data, and
verify, when the defect type of the conversion information indicates an open state, whether or not the pattern indicated by the conversion information includes the crucial defect in the circuit of the wafer based on a result of the LVS verification using the replacement information and the schematic data.

6. The apparatus according to claim 5, wherein the processing unit is configured to:
generate the node numbers respectively corresponding to each pattern indicated by the design data by performing the LVS verification between the schematic data and the design data, and
respectively assign the node numbers to each pattern indicated by the design information.

7. The apparatus according to claim 1, wherein the device to which the verification result is sent is configured to display an indication of the verification result.

8. An apparatus for classifying a defect, the apparatus comprising:
a memory storage; and
a processing unit coupled to the memory storage, wherein the processor is configured to:
acquire pattern data indicative of one or more patterns implemented on a wafer from a storage device,
respectively assign a first set of numbers to each of the one or more patterns indicated by the pattern data, and respectively assign a second set of numbers to each of one or more circuit patterns indicated by design information, the design information including a portion of a figure indicated by design data that corresponds to the pattern data,
generate relation information indicative of one or more correspondences between the first set of numbers and the second set of numbers,
perform classification of a defect type for the pattern data based on the relation information to generate a classification result,
send the classification result to a device,
acquire conversion information by converting the pattern data into Computer Aided Design (CAD) data, the conversion information indicating the one or more patterns implemented on the wafer, and
assign the first set of numbers to the one or more patterns indicated by the conversion information.

9. A defect inspection method comprising:
acquiring pattern data indicative of one or more patterns implemented on a wafer from a storage device;
clipping a portion that corresponds to the pattern data from a figure indicated by design data to generate design information that indicates one or more circuit patterns;
respectively assigning a first set of numbers to each pattern indicated by the pattern data and respectively assigning a second set of numbers to each of the circuit patterns indicated by the design information;
generating relation information indicative of one or more correspondences between the first set of numbers and the second set of numbers;
verifying whether or not the one or more patterns indicated by the pattern data constitute a defect in a circuit of the wafer based on the relation information to generate a verification result; and
sending the verification result to a device,
acquiring conversion information by converting the pattern data into Computer Aided Design (CAD) data, the conversion information indicating the one or more patterns implemented on the wafer;
assigning the first set of numbers to the one or more patterns indicated by the conversion information; and
verifying whether or not the one or more patterns indicated by the conversion information constitute the defect in the circuit of the wafer, based on the relation information.

10. The method of claim 9, further comprising:
performing classification of a defect type for the conversion information based on the relation information; and
verifying whether or not the one or more patterns indicated by the conversion information constitute the defect in the circuit of the wafer according to the defect type for which the classification is performed.

11. The method of claim 10, further comprising:
respectively assigning node numbers to each of the patterns indicated by the design information; and
verifying whether or not the one or more patterns indicated by the conversion information constitute the defect in the circuit of the wafer based on the relation information and the node numbers.

12. The method of claim 11, further comprising:
specifying, when the defect type of the conversion information indicates a short-circuit state, based on the relation information, one of the circuit patterns of the design information which corresponds to a pattern in the short-circuit state in the design information; and
verifying whether or not the one or more patterns indicated by the conversion information constitute the defect in the circuit of the wafer based on a corresponding relation between the specified pattern in the design information and one of the node numbers.

13. The method of claim 12, further comprising:
replacing a portion of the figure indicated by the design data corresponding to conversion information by the conversion information to generate a modified figure, and extracting a portion of the modified figure in a predetermined range which includes the conversion information as replacement information;
performing Layout Versus Schematic (LVS) verification between schematic data of the wafer and at least some of the design data; and
verifying, when the defect type of the conversion information indicates an open state, whether or not the pattern indicated by the conversion information includes the defect in the circuit of the wafer based on a result of the LVS verification using the replacement information.

14. The method of claim 13, further comprising:
generating the node numbers respectively corresponding to each pattern indicated by the design data by performing the LVS verification between the schematic data and the design data, and
respectively assigning the node numbers to each pattern indicated by the design information.

15. A data storage medium storing non-transitory processor-executable instructions which, when executed by a processor, cause the processor to perform a defect inspection method comprising:
acquiring pattern data indicative of one or more patterns implemented on a wafer from a storage device;
clipping a portion that corresponds to the pattern data from a figure indicated by design data to generate design information that indicates one or more circuit patterns;
respectively assigning a first set of numbers to each pattern indicated by the pattern data and respectively assigning a second set of numbers to each of the circuit patterns indicated by the design information;

generating relation information indicative of one or more correspondences between the first set of numbers and the second set of numbers;
verifying whether or not the one or more patterns indicated by the pattern data constitute a defect in a circuit of the wafer based on the relation information to generate a verification result;
sending the verification result to a device;
acquiring conversion information by converting the pattern data into Computer Aided Design (CAD) data, the conversion information indicating the one or more patterns implemented on the wafer;
assigning the first set of numbers to the one or more patterns indicated by the conversion information; and
verifying whether or not the one or more patterns indicated by the conversion information constitute the defect in the circuit of the wafer, based on the relation information.

* * * * *